US007736943B2

United States Patent
Tombler, Jr. et al.

(10) Patent No.: US 7,736,943 B2
(45) Date of Patent: Jun. 15, 2010

(54) CARBON NANOTUBE TRANSISTOR FABRICATION

(75) Inventors: Thomas W. Tombler, Jr., Camarillo, CA (US); Brian Y. Lim, Simi Valley, CA (US)

(73) Assignee: Etamota Corporation, Pasadena, CA (US)

( * ) Notice: Subject to any disclaimer, the term of this patent is extended or adjusted under 35 U.S.C. 154(b) by 222 days.

(21) Appl. No.: 11/870,872

(22) Filed: Oct. 11, 2007

(65) Prior Publication Data

US 2008/0299710 A1    Dec. 4, 2008

Related U.S. Application Data

(63) Continuation of application No. 11/162,548, filed on Sep. 14, 2005, now Pat. No. 7,345,296.

(60) Provisional application No. 60/611,055, filed on Sep. 16, 2004, provisional application No. 60/610,669, filed on Sep. 17, 2004, provisional application No. 60/617,628, filed on Oct. 9, 2004.

(51) Int. Cl.
*H01L 21/44*    (2006.01)

(52) U.S. Cl. ...................... 438/100; 977/843; 977/938; 257/E21.585

(58) Field of Classification Search ............. 438/142, 438/100; 257/E51.04, E21.585; 977/701, 977/720, 743, 750, 780, 781, 785, 936, 843, 977/938
See application file for complete search history.

(56) References Cited

U.S. PATENT DOCUMENTS

| | | | |
|---|---|---|---|
| 6,129,901 A | 10/2000 | Moskovits et al. |
| 6,423,583 B1 | 7/2002 | Avouris et al. |
| 6,465,813 B2 | 10/2002 | Ihm |
| 6,566,704 B2 | 5/2003 | Choi et al. |
| 6,590,231 B2 | 7/2003 | Watanabe et al. |
| 6,707,098 B2 | 3/2004 | Hofmann et al. |
| 6,740,910 B2 | 5/2004 | Roesner et al. |
| 6,759,693 B2 | 7/2004 | Vogeli et al. |
| 6,798,000 B2 | 9/2004 | Luyken et al. |
| 6,803,260 B2 | 10/2004 | Shin et al. |
| 6,809,361 B2 | 10/2004 | Honlein et al. |
| 6,815,294 B2 | 11/2004 | Choi et al. |
| 6,830,981 B2 | 12/2004 | Lee et al. |
| 6,833,567 B2 | 12/2004 | Choi et al. |
| 6,852,582 B2 | 2/2005 | Wei et al. |
| 6,855,603 B2 | 2/2005 | Choi et al. |
| 6,866,891 B2 | 3/2005 | Liebau et al. |

(Continued)

OTHER PUBLICATIONS

Bethune, D.S. et al., "Cobalt-catalysed Growth of Carbon Nanotubes with Single-atomic-layer Walls", Letters to Nature, vol. 363, Jun. 17, 1993, pp. 605-607, Nature Publishing Group.

(Continued)

*Primary Examiner*—Thao X Le
*Assistant Examiner*—Tanika Warrior
(74) *Attorney, Agent, or Firm*—Aka Chan LLP

(57) ABSTRACT

During fabrication of single-walled carbon nanotube transistor devices, a porous template with numerous parallel pores is used to hold the single-walled carbon nanotubes. The porous template or porous structure may be anodized aluminum oxide or another material. A gate region may be provided one end or both ends of the porous structure. The gate electrode may be formed and extend into the porous structure.

25 Claims, 20 Drawing Sheets

U.S. PATENT DOCUMENTS

| | | | |
|---|---|---|---|
| 6,891,227 | B2 | 5/2005 | Appenzeller et al. |
| 6,927,982 | B2 | 8/2005 | Mergenthaler |
| 6,995,416 | B2 | 2/2006 | Reisinger et al. |
| 6,998,634 | B2 | 2/2006 | Cheong et al. |
| 7,301,191 | B1* | 11/2007 | Tombler et al. ............ 257/296 |
| 2002/0153160 | A1 | 10/2002 | Hofmann et al. |
| 2002/0173089 | A1 | 11/2002 | Zhu |
| 2003/0148562 | A1 | 8/2003 | Luyken et al. |
| 2003/0155591 | A1 | 8/2003 | Kreupl |
| 2003/0178617 | A1 | 9/2003 | Appenzeller et al. |
| 2003/0179559 | A1 | 9/2003 | Engelhardt et al. |
| 2004/0004235 | A1 | 1/2004 | Lee et al. |
| 2004/0169281 | A1* | 9/2004 | Nguyen et al. ............ 257/758 |
| 2004/0224490 | A1 | 11/2004 | Wei et al. |
| 2004/0232426 | A1 | 11/2004 | Graham et al. |
| 2004/0233649 | A1 | 11/2004 | Honlein et al. |
| 2004/0253741 | A1 | 12/2004 | Star et al. |
| 2005/0012163 | A1 | 1/2005 | Wei et al. |
| 2005/0029654 | A1 | 2/2005 | Mio et al. |
| 2005/0051805 | A1 | 3/2005 | Kim et al. |
| 2005/0056826 | A1 | 3/2005 | Appenzeller et al. |
| 2005/0095780 | A1 | 5/2005 | Gutsche et al. |
| 2005/0145838 | A1 | 7/2005 | Furukawa et al. |
| 2005/0156203 | A1 | 7/2005 | Bae et al. |
| 2008/0206964 | A1* | 8/2008 | Tombler et al. ............ 438/466 |

OTHER PUBLICATIONS

Cassell, Alan M. et al., "Large Scale CVD Synthesis of Single-Walled Carbon Nanotubes", J. Phys. Chem. B, vol. 103, No. 31, 1999, pp. 6484-6492, American Chemical Society.

Choi, Jimsub et al., "Monodisperse Metal Nanowire Arrays on Si by Integration of Template Synthesis with Silicon Technology," Journal of Materials Chemistry, vol. 13, Mar. 2003, pp. 1100-1103.

Choi, Hee Cheul et al., "Efficient Formation of Iron Nanoparticle Catalysts on Silicon Oxide by Hydroxylamine for Carbon Nanotube Synthesis and Electronics", Nano Letters, vol. 3, No. 2, pp. 157-161, Dec. 2002, American Chemical Society.

Choi, Won Bong et al., "Aligned Carbon Nanotubes for Nanoelectroncis", Nanotechnology, vol. 15, pp. S512-S516,2004, Institute of Physics Publishing Ltd.

Choi, Won Bong et al., "Selective Growth of Carbon Nanotubes for Nanoscale Transistors", Advanced Functional Materials, vol. 13, No. 1, pp. 80-84, Jan. 2003, Wiley-VCH Verlag GmbH & Co. KGaA.

Choi, Won Bong et al., "Ultra-high Density Nanotransistors by Using Selectively Grown Vertical Nanotubes", Applied Physics Letters, vol. 79, No. 22, pp. 3696-3698, Nov. 26, 2001, American Institute of Physics.

Clemems, Steven C. et al., "Synchronous Changes in Seawater Strontium Isotope Composition and Global Climate", Letters to Nature, vol. 363, Jun. 17, 1993, p. 607, Nature Publishing Group.

Collins, Philip G. et al., "Engineering Carbon Nanotubes and Nanotube Circuits Using Electrical Breakdown", www.sciencemag.org, vol. 292, pp. 706-709, Apr. 27, 2001.

Das, B. et al., "Novel Template-based Semiconductor Nanostructures and their Applications", Applied Physics A—Materials Science & Processing, vol. 71, pp. 681-688, Sep. 13, 2000, Springer-Verlag.

Ebbesen, T.W. et al., "Large-scale Synthesis of Carbon Nanotubes", Letters to Nature, vol. 358, pp. 220-222, Jul. 16, 1992, Nature Publishing Group.

Hamada, Noriaki et al., "New One-Dimensional Conductors: Graphitic Microtubules", Physical Review Letter, vol. 68, No. 10, pp. 1579-1581, Mar. 9, 1992, The American Physical Society.

Iijima, Sumio, "Helical Microtubules of Graphitic Carbon", Letters to Nature, vol. 354, pp. 56-58, Nov. 7, 1991, Nature Publishing Group.

Iijima, Sumio et al., "Single-shell Carbon Nanotubes of 1-nm Diameter", Letters to Nature, vol. 363, pp. 603-605, Jun. 17, 1993, Nature Publishing Group.

Javey, Ali et al., "Ballistic Carbon Nanotube Field-effect Transistors", Letters to Nature, vol. 424, pp. 654-657, Aug. 7, 2003, Nature Publishing Group.

Javey, Ali et al., "Self-Aligned Ballistic Molecular Transistors and Electrically Parallel Nanotube Arrays", Nano Letters, vol. 4, No. 7, pp. 1319-1322, Jun. 23, 2004, American Chemical Society.

Journet, C. et al., "Large-scale Production of Single-walled Carbon Nanotubes by the Electric-arc Technique", Letters to Nature, vol. 388, pp. 756-758, Aug. 21, 1997, Nature Publishing Group.

Kong, Jing et al., "Synthesis of Individual Single-walled Carbon Nanotubes on Patterned Silicon Wafers", Letters to Nature, vol. 395, pp. 878-881, Oct. 29, 1998, Nature Publishing Group.

Krishnan, Ramkumar et al., "Wafer-Level Ordered Arrays of Aligned Carbon Nanotubes with Controlled Size and Spacing on Silicon", Nanotechnology, vol. 16, pp. 841-845, Apr. 11 2005, Institute of Physics Publishing.

Krupke, Ralph et al., "Separation of Metallic from Semiconducting Single-walled Carbon Nanotubes", www.sciencemag.org, vol. 301, pp. 344-347, Jul. 18, 2003.

Kyotani, Takashi et al., "Formation of Ultrafine Carbon Tubes by Using an Anodic Aluminum Oxide Film as A Template", Chemistry of Materials, vol. 7, No. 8, Aug. 1995, American Chemical Society.

Kyotani, Takashi et al., "Preparation of Ultrafine Carbon Tubes in Nanochannels of an Anodic Aluminum Oxide Film", Chemistry of Materials, vol. 8, No. 8, pp. 2109-2113, 1996, American Chemical Society.

Li, Jing et al., "Nanoscale Electroless Metal Deposition in Aligned Carbon Nanotubes", Chemistry of Materials, vol. 10, No. 7, pp. 1963-1967, 1998, American Chemical Society.

Li, Shengdong et al., "Carbon Nanotube Transistor Operation at 2.6 GHz", Nano Letters, vol. 4, No. 4, pp. 753-756. Mar. 23, 2004, American Chemical Society.

Li, Yiming et al., "Growth of Single-walled Carbon Nanotubes from Discrete Catalytic Nanoparticles of Various Sizes", J. Phys. Chem. B, vol. 105, No. 46, pp. 11424-11431, Oct. 31, 2001, American Chemical Society.

Masuda, Hideki et al.,"Ideally Ordered Anodic Porous Alumina Mask Prepared by Imprinting of Vacuum-Evaporated Al on Si", Jpn. J. Appl. Phys., vol. 40, pp. L1267-L1269, Nov. 15, 2001, Japan Society of Applied Physics.

Meng, Guowen et al., "Controlled Fabrication of Hierarchically Branched Nanopores, Nanotubes, and Nanowires", PNAS, vol. 102, No. 20, pp. 7074-7078, May 17, 2005.

Miney, Paul G. et al., "Growth and Characterization of a Porous Aluminum Oxide Film Formed on an Electrically Insulating Support", Electrochemical and Solid-State Letters, vol. 6, pp. B42-B45, Jul. 29, 2003, The Electrochemical Society.

Myung, N.V. et al., "Alumina Nanotemplate Fabrication on Silicon Substrate", Nanotechnology, vol. 15, pp. 833-838, Apr. 26, 2004, Institute of Physics Publishing.

Parthasarathy, Ranjani V. et al., "Template Synthesis of Graphitic Nanotubules", Advanced Materials, vol. 7, No. 11, pp. 896-897, 1995, VCH Verlagsgesellschaft mbH.

Peng, Yong et al., "Magnetic Properties and Magnetization Reversal of α-Fe Nanowires Deposited in Alumina Film", Journal of Applied Physics, vol. 87, No. 10, pp. 7405-7408, May 15, 2000, American Institute of Physics.

Seidel, Robert et al., "High-Current Nanotube Transistors", Nano Letters, vol. 4, No. 5, pp. 831-834, Apr. 10, 2004, American Chemical Society.

Seidel, Robert et al., "In-Situ Contacted Single-Walled Carbon Nanotubes and Contact Improvement by Electroless Deposition", Nano Letters, vol. 3, No. 7, pp. 965-968, May 20, 2003, American Chemical Society.

Suh, Jung Sang et al., "Highly Ordered Two-Dimensional Carbon Nanotube Arrays", Applied Physics Letters, vol. 75, No. 14, pp. 2047-2049, Oct. 4, 1999, American Institute of Physics.

Tans, Sander J. et al., "Room-Temperature Transistor Based on a Single Carbon Nanotube", Letters to Nature, vol. 393, pp. 49-52, May 7, 1998, Nature Publishing Group.

Tatarenko N.I. et al., "Geometry and Element Composition of a Nanoscale Field Emission Array Formed by Self-Organization in Porous Anodic Aluminum Oxide", Solid State Electronics, vol. 45, pp. 1009-1016, 2001, Elsevier Science Ltd.

Wu, M.T. et al., "Effect of Polishing Pretreatment on the Fabrication of Ordered Nanopore Arrays on Aluminum Foils by Anodization", J. Vac. Sci. Technol., B 20, pp. 776-782, May/Jun. 2002, American Vacuum Society.

Zheng, Ming et al., "DNA-assisted Dispersion and Separation of Carbon Nanotubes", Nature Materials, vol. 2, pp. 338-342, May 2003, Nature Publishing Group.

Cheng, Guosheng et al., "Current Rectification in a Single GaN Nanowire with a Well-defined p-n Junction," Applied Physics Letters, vol. 83, No. 8, Aug. 25, 2003, pp. 1578-1580.

Gudiksen, Mark S. et al., "Growth of Nanowire Superlattice Structures for Nanoscale Photonics and Electronics," Nature, vol. 415, Feb. 7, 2002, pp. 617-620.

Hu, Jiangtao et al., "Controlled Growth and Electrical Properties of Heterojunctions of Carbon Nanotubes and Silicon Nanowires," Nature, vol. 399, May 6, 1999, pp. 48-51.

Hu, Ping'an et al., "Multiwall Nanotubes with Intramolecular Junctions (CNx/C): Preparation, Rectification, Logic Gates, and Application," Applied Physics Letters, vol. 84, No. 24, Jun. 14, 2004, pp. 4932-4934.

Lee, Jin Seung et al., "Growth of Carbon Nanotubes on Anodic Aluminum Oxide Templates: Fabrication of a Tube-in-Tube in-Tube and Linearly Joined Tube," Chemical Materials, vol. 13, No. 7, 2001, pp. 2387-2391.

Lee, J.U. et al., "Carbon Nanotube p-n Junction Diodes," Applied Physics Letters, vol. 85, No. 1, Jul. 5, 2004, pp. 145-147.

Li, Meng-Ke et al., "The Synthesis of MWNTs/SWNTs Multiple Phase Nanowire Arrays in Porous Anodic Aluminum Oxide Templates," Materials Science & Engineering, A354, 2003, pp. 92-96.

Suh, Jung Sang et al., "Linearly Joined Carbon Nanotubes," Synthetic Metals, 123, 2001, pp. 381-383.

Wind, S.J. et al., "Vertical Scaling of Carbon Nanotube Field-effect Transistors Using Top Gate Electrodes," Applied Physics Letters, vol. 80, No. 20, May 20, 2002, pp. 3817-3819.

Zhou, Chongwu et al., "Modulated Chemical Doping of Individual Carbon Nanotubes," Science, vol. 290, Nov. 24, 2000, pp. 1552-1555.

* cited by examiner

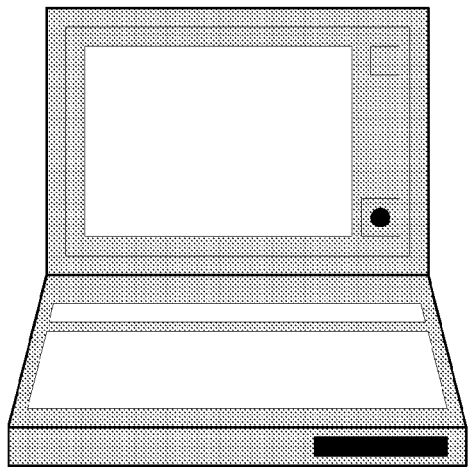
Portable Computer
Figure 1
Figure 2
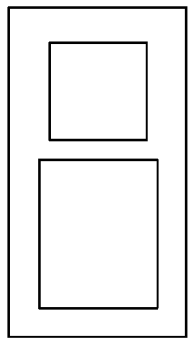
Mobile Phone
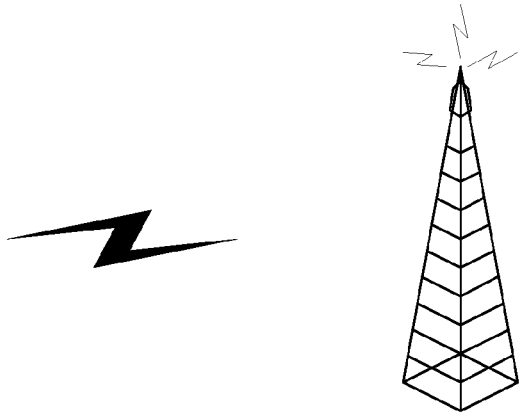
Mobile Phone Network
Base Station
Figure 3

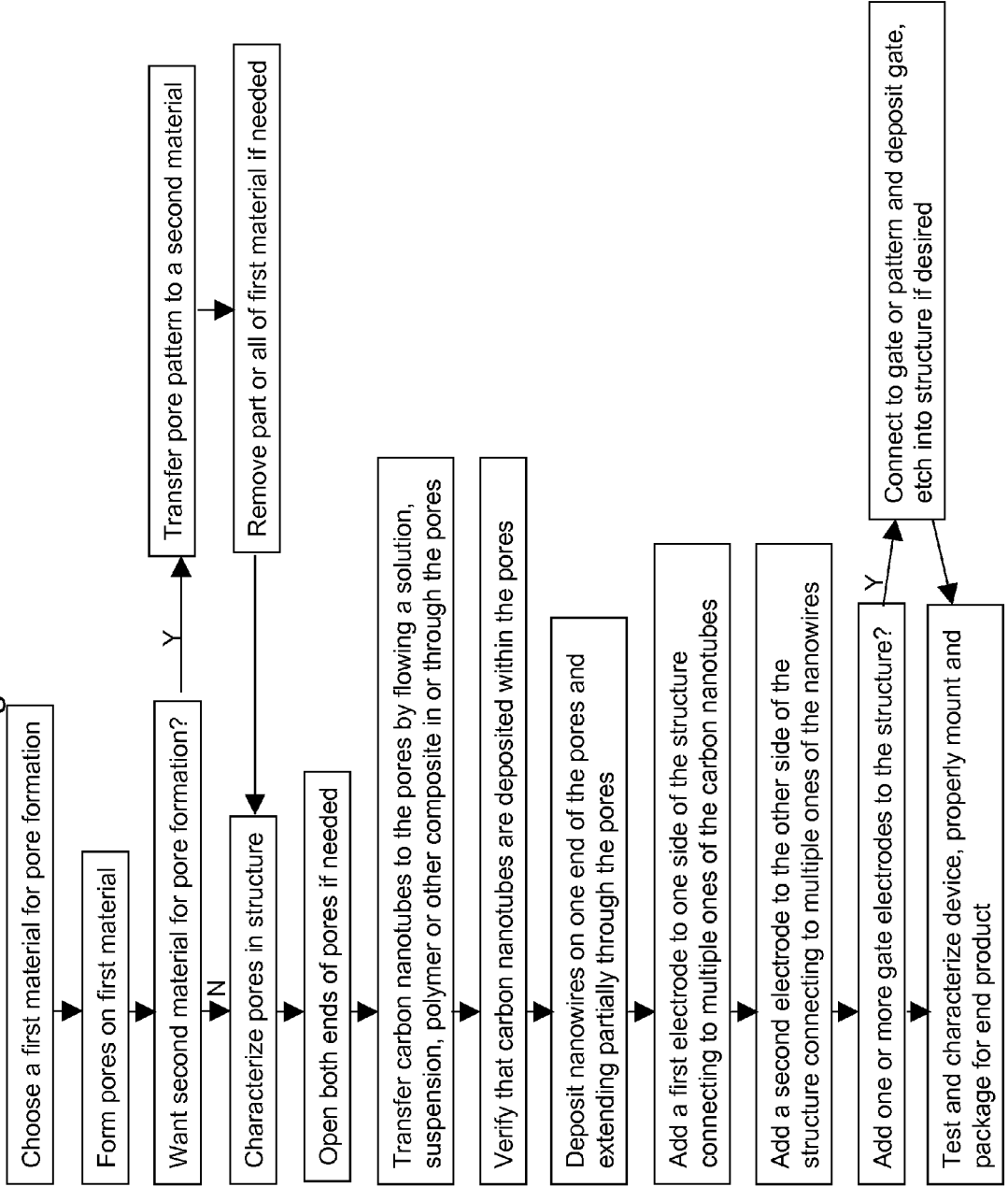

CARBON NANOTUBE TRANSISTOR FABRICATION

CROSS-REFERENCE TO RELATED APPLICATIONS

This application is a continuation of U.S. patent application Ser. No. 11/162,548, filed Sep. 14, 2005, which claims the benefit of U.S. provisional patent applications 60/611,055, filed Sep. 16, 2004; 60/610,669, filed Sep. 17, 2004; and 60/617,628, filed Oct. 9, 2004. These applications are incorporated by reference along with all other references cited in this application.

BACKGROUND OF THE INVENTION

The present invention relates to fabrication of semiconductor devices and more specifically to fabricating carbon nanotube transistor devices.

The age of information and electronic commerce has been made possible by the development of transistors and electronic circuits, and their miniaturization through integrated circuit technology. Integrated circuits are sometimes referred to as "chips." Many numbers of transistors are used to build electronic circuits and integrated circuits. Modern microprocessor integrated circuits have over 50 million transistors and will have over 1 billion transistors in the future.

Some type of circuits include digital signal processors (DSPs), amplifiers, dynamic random access memories (DRAMs), static random access memories (Slams), erasable programmable read only memories (EPROMs), electrically erasable programmable read only memories (EEPROMs), Flash memories, microprocessors, application specific integrated circuits (ASICs), and programmable logic. Other circuits include amplifiers, operational amplifiers, transceivers, power amplifiers, analog switches and multiplexers, oscillators, clocks, filters, power supply and battery management, thermal management, voltage references, comparators, and sensors.

Electronic circuits have been widely adopted and are used in many products in the areas of computers and other programmed machines, consumer electronics, telecommunications and networking equipment, wireless networking and communications, industrial automation, and medical instruments, just to name a few. Electronic circuits and integrated circuits are the foundation of computers, the Internet, voice over IP (VoIP), and on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

The building blocks in electronics are electrical and electronic elements. These elements include transistors, diodes, resistors, and capacitors. There are many numbers of these elements on a single integrated circuit. Improvements in these elements and the development of new and improved elements will enhance the performance, functionality, and size of the integrated circuit.

An important building block in electronics is the transistor. In fact, the operation of almost every integrated circuit depends on transistors. Transistors are used in the implementation of many circuits. Improving the characteristics and techniques of making transistors will lead to major improvements in electronic and integrated circuit.

Presently silicon-based metal-oxide-semiconductor field-effect transistors (MOSFETs) are the workhorses of electronic systems and power electronics systems. However, demand for increasing performance requirements is pushing the boundaries of silicon material. It is desirable to have transistors with improved characteristics, especially transistors having higher current density, higher thermal conductivity, and higher switching frequency.

Therefore, there is a need for an improved method of fabricating carbon nanotube transistor devices.

BRIEF SUMMARY OF THE INVENTION

The present invention relates to fabricating nanotube transistor devices using a porous template to hold the nanotubes. In a specific implementation, the transistors include single-walled carbon nanotubes (SWNT), which are within the pores of structure. These structures may use templates that include anodized aluminum oxide or other materials. A gate region may be provided one end or both ends of the porous structure. The gate electrode may be formed on, in, or extend into the porous structure, or a combination of these.

Embodiments of the present invention are especially suited for power transistor or power amplifier applications, or both. Transistors of the invention may be especially suited for a wide range of frequencies, switches, power supplies, and driving motors. The devices will allow for high currents, high current densities, and high power. Aspects of the invention are applicable to diodes, rectifiers, silicon controlled rectifiers, varistors, thyristors, and related devices. The invention may combine carbon nanotubes with nanowire elements.

In an embodiment, the invention includes a method of fabricating a transistor including: anodizing an aluminum substrate to produce an alumina template with pores, each having a pore diameter; and exposing the alumina template having pores to a hydrocarbon gas at a temperature to grow carbon nanotubes in the pores, each carbon nanotube having an outer diameter less than the pore diameter in the template in which the carbon nanotube is produced. A first electrode region is formed to electrically connect to first ends of the carbon nanotubes. A second electrode region is formed to electrically connect to second ends of the carbon nanotubes. A gate region is formed on the alumina template.

In an embodiment, a method of the invention includes: providing a porous structure; processing to obtain single-walled carbon nanotubes in pores of the porous structure; providing a first electrode to connect to first ends of the single-walled carbon nanotubes; and providing a second electrode to connect to second ends of the single-walled carbon nanotubes. A gate electrode is formed on the porous structure. One or more voltages are applied to the gate and the first and second electrode to cause a current to flow through the single-walled carbon nanotubes, where at least two nonsemiconducting single-walled carbon nanotubes are destroyed by the current.

In an embodiment, the invention includes a method of making a transistor including: anodizing an aluminum substrate to produce an alumina template with a number of pores, each having a pore diameter; forming a conductive layer in the pores; and forming on the conductive layer in the pores an insulating layer. The alumina template having pores is exposed to a hydrocarbon gas at a temperature to grow carbon nanotubes in the pores, each carbon nanotube having an outer diameter less than the pore diameter in the template in which the carbon nanotube is produced. Alternatively, instead of synthesizing the carbon nanotubes in the pores, the carbon nanotubes may be transferred to the pores.

In an embodiment, the invention includes a method of making a transistor device including: anodizing an aluminum layer to produce an alumina template with a number of pores, each having a pore diameter; exposing the template having pores to a hydrocarbon gas at a temperature to grow carbon nanotubes in the pores, each carbon nanotube having an outer diameter less than the pore diameter in the template in which the carbon nanotube is produced; forming a first electrode region to electrically connect to first ends of the carbon nanotubes; forming a second electrode region to electrically connect to second ends of the carbon nanotubes; and forming a gate region on the template.

In a embodiment, the invention includes a method of making a transistor device including: forming a number of pores in a template, each pore having a pore diameter; exposing the template having pores to a hydrocarbon gas at a temperature to grow carbon nanotubes in the pores, each carbon nanotube having an outer diameter less than the pore diameter in the template in which the carbon nanotube is produced; forming a first electrode region to electrically connect to first ends of the carbon nanotubes; forming a second electrode region to electrically connect to second ends of the carbon nanotubes; and forming a gate region on the template.

In further embodiments, the invention includes: The use of vertical single-walled carbon nanotubes to form parallel redundant transistors. The use of parallel single-walled carbon nanotube transistors to supply power to an electronic circuit of a notebook computer. The use of parallel single-walled carbon nanotube transistors to supply power to an electronic circuit of a mobile telecommunications device. The use of parallel single-walled carbon nanotube transistors to supply power to a recharging circuit of an automobile. The use of a gate region extending vertically into a structure to influence operation of vertical single-walled carbon nanotubes of the structure. The use of single-walled carbon nanotube transistors of the invention to form an integrated circuit.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 shows a computing system incorporating the invention.

FIG. 2 shows a motor vehicle system incorporating the invention.

FIG. 3 shows a telecommunications system incorporating the invention.

FIG. 24 shows a flow diagram of a technique for fabricating a single-walled carbon nanotube diode device using a liquid deposition.

DETAILED DESCRIPTION OF THE INVENTION

Figure 4:
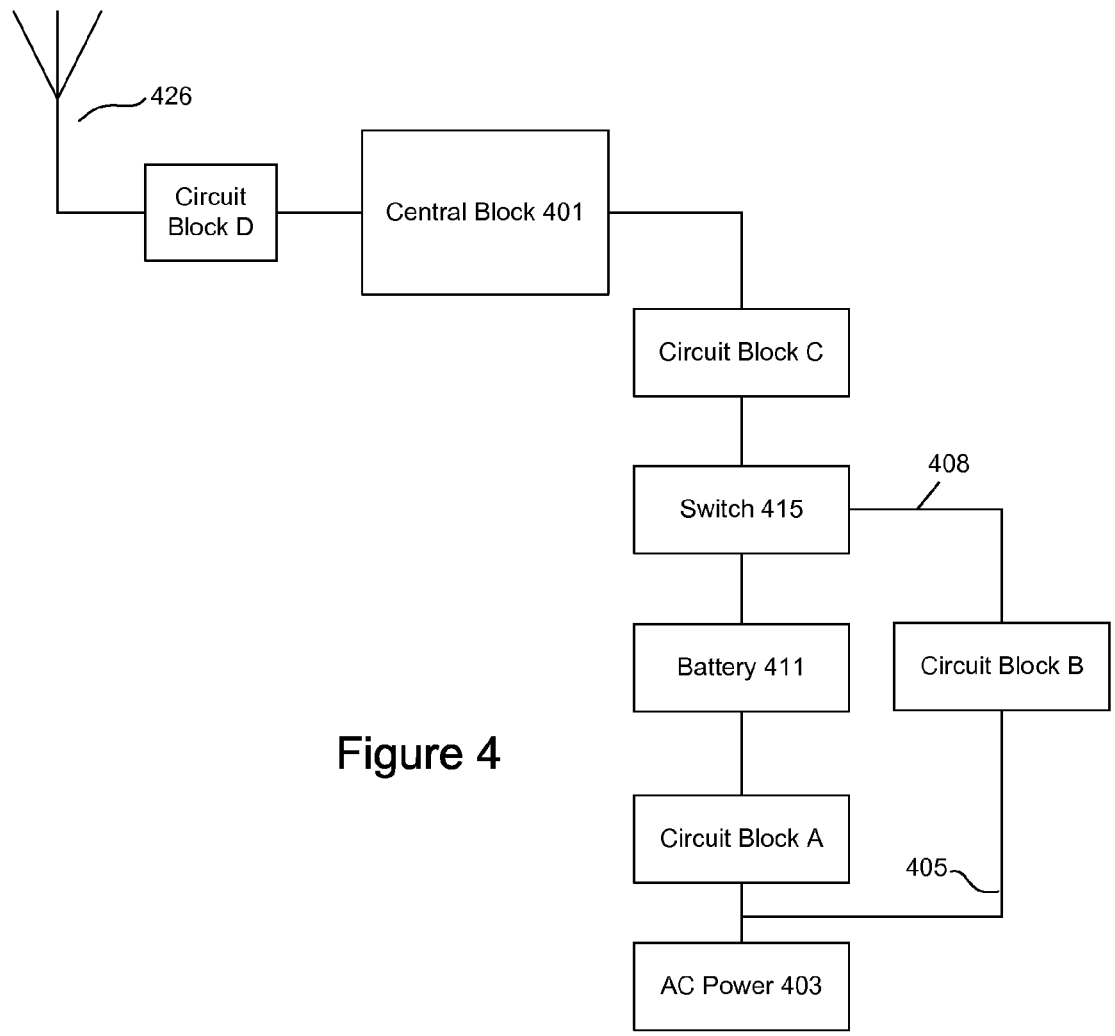
FIG. 4 shows a block diagram of a system incorporating the invention.

The invention provides a carbon nanotube device and techniques for manufacturing such a device, especially a transistor device. In a specific embodiment, the carbon nanotube device is a single-wall carbon nanotube (SWNT) transistor, where the single-walled carbon nanotube is an element of the transistor. A specific application of a single-wall carbon nanotube device of the invention is as a power transistor, a type of transistor capable of passing relatively high currents compared to standard transistors. Carbon nanotube transistors of the invention may be fabricated independently or in combination with devices and with devices of different technologies.

FIG. 1 shows an example of an electronic system incorporating one or more carbon nanotube transistors or rectifying devices of the invention, or combinations of these. Electronic systems come in many different configurations and sizes. Some electronic systems are portable or handheld. Such portable systems typically may be battery operated.

The battery is typically a rechargeable type, such as having nickel cadmium (NiCd), nickel metal hydride (NiMH), lithium ion (Li-Ion), lithium polymer, lead acid, or another rechargeable battery chemistry. The system can operate for a certain amount of time on a single battery charge. After the battery is drained, it may be recharged and then used again.

In a specific embodiment, the electronic system is a portable computing system or computer, such as a laptop or notebook computer. A typical computing system includes a screen, enclosure, and keyboard. There may be a pointing device, touchpad, or mouse equivalent device having one or more buttons. The enclosure houses familiar computer components, some of which are not shown, such as a processor, memory, mass storage devices, battery, wireless transceiver, and the like. Mass storage devices may include mass disk drives, floppy disks, magnetic disks, fixed disks, hard disks, CD-ROM and CD-RW drives, DVD-ROM and DVD-RW drive, Flash and other nonvolatile solid-state storage drives, tape storage, reader, and other similar devices, and combinations of these.

Other examples of portable electronics and battery-operated systems include electronic game machines (e.g., Sony PlayStation Portable), DVD players, personal digital assistants (PDAs), remote controls, mobile phones, remote controlled robots and toys, power tools, still and movie cameras, medical devices, radios and wireless transceivers, and many others. The transistor of the invention may be used in any of these and other electronic and battery-operated systems to provide similar benefits.

Transistors or rectifying devices of the invention, or combinations of these, may be used in various circuits of electronic systems including circuitry for the rapid recharging of the battery cells and voltage conversion, including DC-DC conversion. For example, each laptop power supply typically has eight power transistors. Transistors of the invention may be used in circuitry for driving the screen of the system. The screen may be a flat panel display such as a liquid crystal display (LCD), plasma display, or organic light emitting diode (OLED) display. Transistors of the invention may be used in circuitry for the wireless operation of the system such as circuitry for wireless networking (e.g., Wi-Fi, 802.11a, 802.11b, 802.11g, or 802.11n) or other wireless connectivity (e.g., Bluetooth).

FIG. 2 shows an example of a vehicle incorporating one or more carbon nanotube transistors or rectifying devices of the invention, or combinations of these. Although the figure shows a car example, the vehicle may be a car, automobile, truck, bus, motorized bicycle, scooter, golf cart, train, plane, boat, ship, submarine, wheelchairs, personal transportations devices (e.g., Segway Human Transporter (HT)), or other. In a specific embodiment, the vehicle is an electric vehicle or hybrid-electric vehicle, whose motion or operation is provided, at least in part, by electric motors.

In an electric vehicle, rechargeable batteries, typically lead acid, drive the electric motors. These electric or hybrid-electric vehicles include transistors or devices of the invention in, among other places, the recharging circuitry used to recharge the batteries. For a hybrid-electric vehicle, the battery is recharged by the motion of the vehicle. For a fully electric vehicle, the battery is charged via an external source, such as an AC line or another connection to a power grid or electrical power generator source. The vehicular systems may also include circuitry with transistors of the invention to operate their on-board electronics and electrical systems.

FIG. 3 shows an example of a telecommunications system incorporating one or more carbon nanotube transistors or rectifying devices of the invention, or combinations of these. The telecommunications system has one or more mobile phones and one or more mobile phone network base stations. As described above for portable electronic devices, each mobile phone typically has a rechargeable battery that may be charged using circuitry with transistors or devices of the invention. Furthermore, for the mobile phone or other wireless device, there may be transceiver or wireless broadcasting circuitry implemented using transistors of the invention. And a mobile phone network base station may have transceiver or broadcasting circuitry with transistors or devices of the invention.

FIG. 4 shows a more detailed block diagram of a representative system incorporating the invention. This is an exemplary system representative of an electronic device, notebook computer, vehicle, telecommunications network, or other system incorporating the invention as discussed above. The system has a central block 401, a component of the system receiving power. The central block may be a central processing unit, microprocessor, memory, amplifier, electric motor, display, or other.

DC power is supplied to the central block from a rechargeable battery 411. This battery is charged from an AC power source 403 using a circuit block A including carbon nanotube transistors or devices of the invention. Circuit block A may include circuitry to convert AC power to DC power, and this circuitry may also include carbon nanotube transistors or rectifying devices. Although a single circuit block A is shown to simplify the diagram, the circuitry may be divided into two circuit blocks, one block for AC-to-DC conversion and another block for the recharging circuitry.

Central block may be a device that can be powered either by the AC line or from the battery. In such an embodiment, there would be a path from AC power, connection 405, circuit block B, and connection 408 to a switch 415. The battery is also connected to switch 415. The switch selects whether power is supplied to the central block from the battery or from the AC power line (via circuit block B). Circuit block B may include AC-to-DC conversion circuitry implemented using carbon nanotube transistors or devices of the invention. Furthermore, in an implementation of the invention, switch 415 includes carbon nanotube transistors or devices of the invention.

Circuit block B may be incorporated into a power supply for central block. This power supply may be switching or linear power supply. With carbon nanotube transistors of the invention, the power supply will be able to provide more power in a more compact form factor than using typical transistors. The power supply of the invention would also generate less heat, so there is less likelihood of overheating or fire. Also, a fan for the power supply may not be necessary, so a system incorporating a power supply having nanotube transistors of the invention may be quieter.

The path from AC power through circuit block B is optional. This path is not needed in the case there is not an option to supply power from an AC line to the central block. In such a case, switch 415 would also not be used, and battery 411 would directly connect to circuit block C. As can be appreciated, there are many variations to how the circuitry of the system in the figure may be interconnected, and these variations would not depart from the scope of the invention.

Circuit block C is circuitry such as a DC-to-DC power converter or voltage regulator including carbon nanotube transistors or devices of the invention. This circuitry takes DC power of a certain voltage and converts it to DC voltage at a different voltage level. For example, the battery or output of circuit block B may have an output voltage of about 7.2 volts, but the central block uses 3 volts. Circuit block C converts the 7.2 volts to 3 volts. This would be a step-down converter since voltage of a higher level is being converted to a lower level.

In the case central block 401 has a wireless component, a path including circuit block D and antenna 426 will be used to transmit and receive wireless signals. Circuit block includes carbon nanotube transistors of the invention to perform the signal transmission or reception. For example, the carbon nanotube transistors may be used as output devices in an amplifier generating the wireless signal. In an implementation of the invention without a wireless component, then circuit block D and the antenna would not be present.

Figure 5:
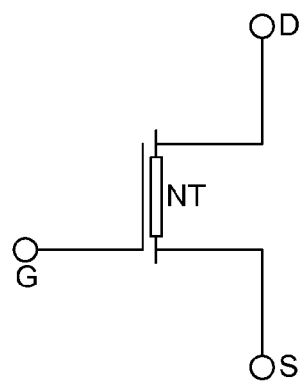
FIG. 5 shows a circuit symbol for a carbon nanotube transistor.

FIG. 5 shows a symbol of a carbon nanotube transistor of the invention. According to the invention, transistors are manufactured using carbon nanotubes (CNTs). And more specifically, field-effect transistors (FETs) are manufactured using single-walled carbon nanotubes. The transistor has a gate node G, drain node D, and source node S. This carbon nanotube transistor of the invention does not have a bulk, substrate, or well node as would a typical MOS transistor of an integrated circuit. In other embodiments of the invention, the carbon nanotube transistor may have a bulk node.

When an appropriate voltage is applied to the gate node, a channel can form in a carbon nanotube, denoted by NT. Current can flow from drain to source. Operation of the single-walled carbon nanotube transistor of the invention is analogous to a metal oxide semiconductor (MOS) transistor.

The single-walled carbon nanotube is a relatively recently discovered material. A single-walled carbon nanotube can be conceptually described as a single sheet of graphite (also called graphene) that is configured into a seamless cylindrical roll with diameters typically about 1 nanometer, but can range from about 0.4 to about 5 nanometers. The cylinder may be a one-layer thick layer. For example, a nanotube may be 0.5, 0.7, 0.8, 0.9, 1.0, 1.1, 1.2, 1.3, 1.6, 2, 2.5, 2.7, 3, 3.2, 3.6, 3.8, 4.0, 4.2, 4.3, 4.5, 4.6, 4.7, or 4.9 nanometers. Depending on the process technology, single-walled carbon nanotubes may have diameters less than 0.7 nanometers or greater than 5 nanometers.

In addition to single-walled carbon nanotubes, another type of carbon nanotube is a multiwalled carbon nanotube (MWNT). A multiwalled carbon nanotube is different from single-walled carbon nanotube. Instead of a single carbon nanotube cylinder, multiwalled carbon nanotubes have concentric cylinders of carbon nanotubes. Consequently, multiwalled carbon nanotubes are thicker, typically having diameters of about 5 nanometers and greater. For example, multiwalled carbon nanotubes may have diameters of 6, 7, 8, 10, 11, 15, 20, 30, 32, 36, 50, 56, 62, 74, 78, 86, 90, 96, or 100 nanometers, or even larger diameters.

Single-walled carbon nanotubes have unique electrical, thermal, and mechanical properties. Electronically they can be metallic or semiconducting based on their chirality or helicity, which is determined by their (n, m) designation, which can be thought of as how the graphite sheet is rolled into a cylinder. Typically, individual single-walled carbon nanotubes can handle currents of 20 microamps and greater without damage. Compared to multiwalled carbon nanotubes, single-walled carbon nanotubes generally do not have structural defects, which is significant for electronics applications.

Single-walled carbon nanotube material has proven to have incredible materials properties. It is the strongest known material—about 150 times stronger than steel. It has the highest known thermal conductivity (about 6000 watts per meter per degree Kelvin). The properties of semiconducting single-walled carbon nanotubes are indeed promising. They may be used in field-effect transistors (FETs), nonvolatile memory, logic circuits, and other applications.

With regard to transistor applications, single-walled nanotube devices have "on" resistances and switching resistances that are significantly lower than those of silicon. Transistors based on single-walled carbon nanotube technology can handle considerably higher current loads without getting as hot as conventional silicon devices. This key advantage is based on two factors. First, the lower "on" resistance and more efficient switching results in much lower heat generation. Second, single-walled carbon nanotubes have high thermal conductivity ensures that the heat does not build up.

Important considerations in carbon nanotube field effect transistor (CNTFET) design and fabrication are threefold. A first consideration is the controlled and reproducible growth of high quality single-walled carbon nanotubes with the desirable diameter, length, and chirality. A second consideration is the efficient integration of nanotubes into electronic structures. And a third consideration is current nanotube growth and device fabrication processes need to be improved significantly so that they are amenable to scalable and economical manufacturing.

Figure 6:
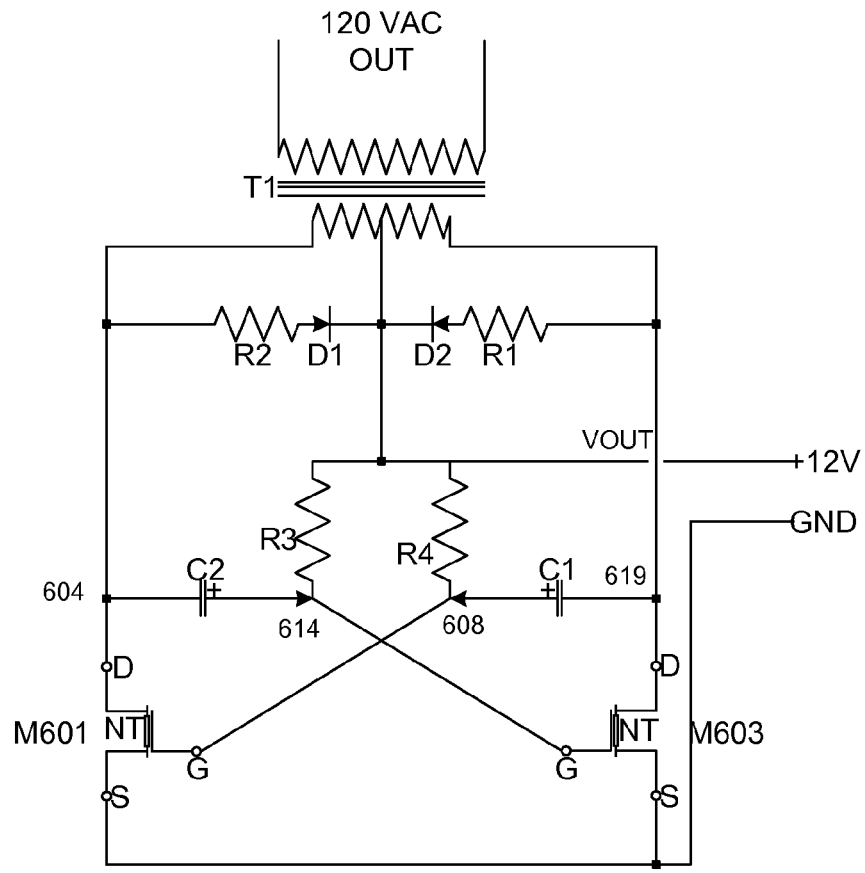
FIG. 6 shows a DC-to-AC inverter circuit using carbon nanotube transistors.

FIG. 6 shows an AC-to-DC converter circuit using two carbon nanotube transistors, M601 and M603, of the invention. The circuitry takes an AC voltage input, such as 120 volts provided at transformer T1 and provides a DC voltage output, such as the 12 volts indicated in the figure. The converter may be designed to take as input any AC voltage, but 120 volts was selected since this is the standard AC line voltage in the U.S. The circuitry may be designed to output any desired DC voltage, less than or more than 12 volts, such as 2 volts, 3, volts, 5 volts, 6 volts, 16 volts, 18 volts, or 20 volts, by varying the circuit components. For example, the resistances R1, R2, R3, and R4 may be varied.

Single-walled carbon nanotube transistor M601 is connected between a node 604 and ground. A gate node of M601 is connected to node 608. A capacitor C2 is connected between 604 and 614, which is connected to a gate of single-walled carbon nanotube transistor M603. M603 is connected between node 619 and ground. A capacitor C1 is connected between 608 and 619. Resistor R3 is connected between DC output, VOUT, and 614. Resistor R4 is connected between VOUT and 608. Between VOUT and 604 are a diode D1 and resistor R2. Between VOUT and 619 are a diode D2 and resistor R1. Nodes 604 and 619 are connected to windings of transformer T1.

The AC-to-DC converter may output significant currents because the converter provides power for circuits having relatively large power needs. Therefore, in such cases, carbon nanotube transistors M601 and M603 will pass relatively large currents. In addition, in a battery recharging battery application, by increasing the current M601 and M603 can pass without overheating or damaging the devices, this will speed-up the rate at which batteries may be recharged.

Figure 7:
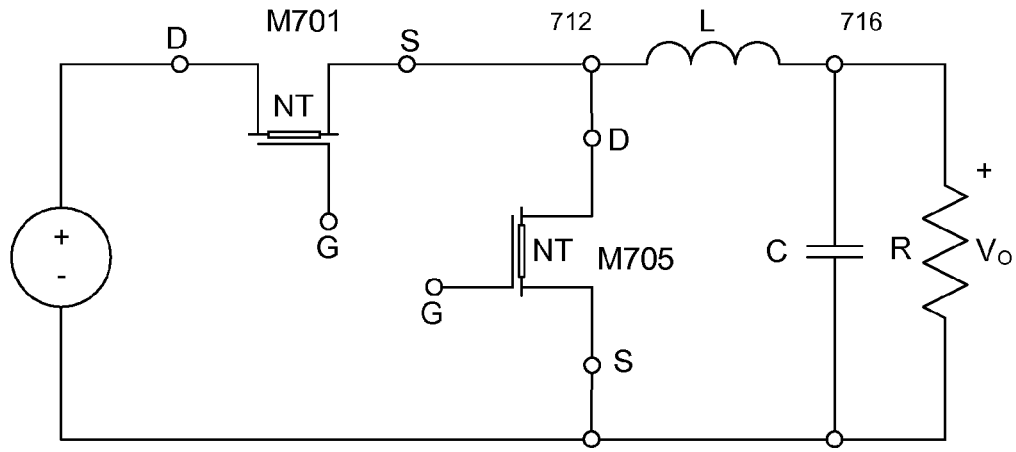
FIG. 7 shows a DC-DC converter circuit using carbon nanotube transistors.

FIG. 7 shows a DC-to-DC converter circuit using two carbon nanotube transistors, M701 and M705, of the invention. The circuit takes a DC input voltage, VIN, and outputs a different DC voltage, VO. For example, VIN may be 7.2 volts or 12 volts, and VO may be 5 volts or 3 volts. Voltage conversion is used in many applications such as portable electronics because batteries may not provide output at a desired voltage level or at a voltage compatible with electronics.

This circuit may also be part of a DC inverter circuit, in which case a voltage output of opposite polarity to the input voltage is provided. For example, if the input voltage is positive, the output voltage of the inverter would be negative. Or if the input voltage is negative, the output voltage of the inverter would be positive.

Single-walled carbon nanotube transistor M701 is connected between VIN+ and node 712. Single-walled carbon nanotube transistor M705 is connected between node 712 and VIN− (or ground). An inductor L is connected between 712 and 716. A capacitor and resistor are connected between 716 and VIN−. An output VO is taken between node 716 and ground.

In a further embodiment of the invention, there may be a first diode connected between a drain and source of transistor M701, and a second diode connected between a drain and source of transistor M705. The first diode may be connected so that current will be allowed to flow in a direction from node 712 to VIN+. The second diode may be connected so that current will be allowed to flow in a direction from ground to node 712.

These diodes may be designed or fabricated using any technique used to obtain devices with diode characteristics including using a diode-connected transistor, where a gate and drain of the transistor are connected together, or other transistor techniques. In another embodiment, a diode may be integrated with a nanotube transistor using a single-walled carbon nanotube and nanowire junction or other junction as will be discussed in more below.

In operation, the converter circuit converts the VIN voltage to a VO or VOUT voltage. A first signal is connected to a gate of transistor M701, and a second signal is connected to a gate of transistor M705. The first and second signals may clock signals or oscillator signals including square waves, pulse trains, sawtooth signals, and the like. The first and second signals and may be generated by a controller for the converter circuit.

Power transistors are high power output stages in electronics that typically carry high currents and power. They are elements in power amplifiers and are used to deliver required amounts of current and power efficiently to a load. Applications include power delivery to devices within integrated circuits, personal computers, cellular phones, wireless base stations, and a variety of electrical devices. Power transistors are also used for high current switches and supplying power to motors.

At the present time, power transistors are bipolar junction transistors (BJT) or metal oxide semiconductor field-effect transistors (MOSFET) based on silicon technology. In addition to these silicon-based devices, other materials are used such as gallium arsenide and gallium nitride. However, silicon bipolar junction transistors and silicon metal oxide semiconductor field-effect transistors, specifically laterally diffused metal oxide semiconductor, dominate the field. The entire power transistor device contains a multitude of linked individual transistors in order to distribute the total current and power. Relevant parameters in power transistors include current carrying and power capability, current gain, efficiency, and thermal resistance.

There are a number of challenges to commercialization of carbon nanotube transistors and replacing current semiconductor technologies, including chirality control, location and orientation control, size and length control, and overall quality control of the properties of single-walled carbon nanotubes on a large scale. These are addressed by the present invention.

An embodiment of the invention is a single-walled carbon nanotube based power transistor device, including a number of single-walled carbon nanotubes. This structure may include aluminum oxide or other material. An electrically conductive source and drain connect each side of vertically aligned single-walled carbon nanotubes. The single-walled carbon nanotubes are within the pores. The gate electrode is patterned to modulate the single-walled carbon nanotube electrical conduction effectively and is electrically isolated from the source and drain. The device of the invention obtains higher current densities and total power densities than can devices according to conventional technology, and the device enables higher current and power devices or equivalent current and power in smaller sized devices.

In one embodiment of the invention, single-walled carbon nanotubes are synthesized within pores of a porous structure. The porous structure is fabricated through any competent method using any competent material. For example, anodization techniques are used on aluminum to produce aluminum oxide. Suitable and effective catalyst for single-walled carbon nanotube synthesis is deposited at the bottom of the pore.

Figure 8:
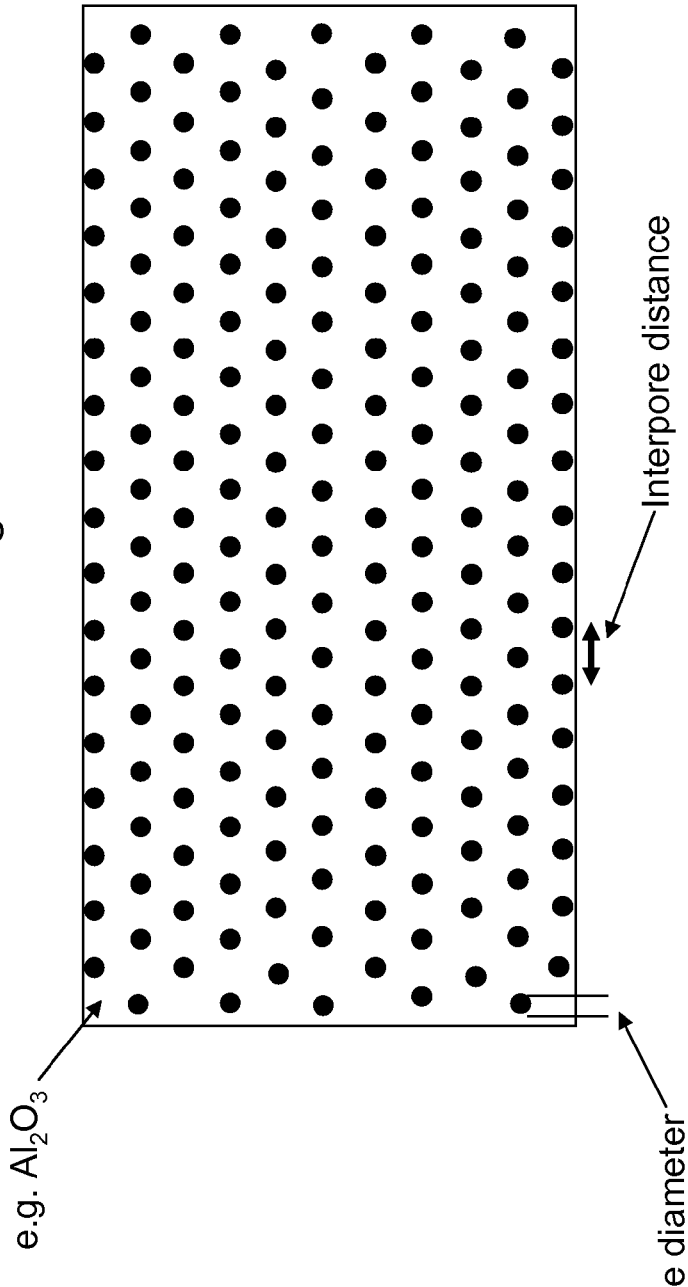
FIG. 8 shows a top view of a porous structure used in a technique of fabricating carbon nanotube transistors of the invention.
Figure 9:
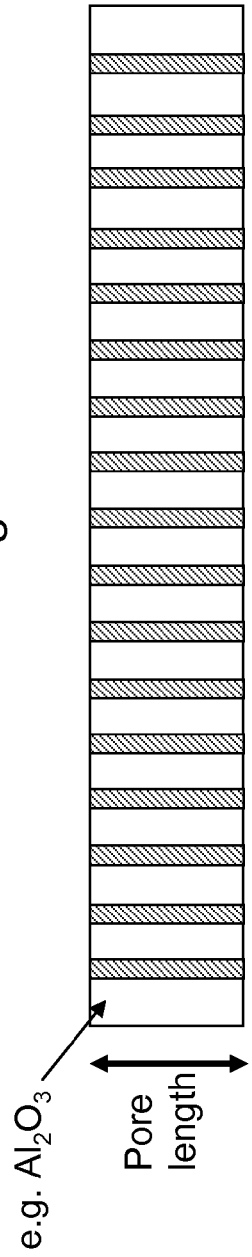
FIG. 9 shows a cross-sectional view of a porous structure used in a technique of fabricating carbon nanotube transistors of the invention.

To fabricate a transistor of the invention, a porous structure or substrate is used. FIG. 8 shows a top view of such a porous structure or substrate. FIG. 9 shows a cross-sectional view of the porous structure. The porous structure may be, for example, an aluminum oxide, $Al_2O_3$, structure in form of an aluminum oxide membrane that achieves a given pore density and pore size. Each of the pores is an opening in the structure. In an embodiment, this opening is generally circular in shape and has a diameter. A pore has pore walls and generally a cylindrical opening. The pore opening may be other shapes and is not necessarily what would be considered a perfect cylindrical (or other shaped) opening. The porous structure may be made from other materials other than aluminum oxide including silicon, silicon germanium, gallium nitride, germanium, gallium arsenide, plastic, polymer, glass, or quartz, or the like, or a combination of these.

The pores will have a pore diameter, an interpore distance, and a pore length. Pore diameter will be about 10 nanometers to 200 nanometers. Pore density will typically be about $10^8$ per square centimeter to about $10^{11}$ per square centimeter. Below is a table A of density of the pores and corresponding interpore distance for various embodiments of the invention for a hexagonal arrangement of pores.

TABLE A

| Density of Pores (per square centimeter) | Interpore Distance (nanometers) |
|---|---|
| $2 * 10^{11}$ | 24 |
| $1 * 10^{11}$ | 34 |
| $5 * 10^{10}$ | 48 |
| $2 * 10^{10}$ | 76 |
| $1 * 10^{10}$ | 107 |
| $1 * 10^9$ | 340 |

Pore length will typically be from about 500 nanometers to about 1.5 microns. However, in other embodiments, the pore length may be less than 500 nanometers such as short as 50 nanometers or less, or the pore length may be longer than 1.5 microns, such as up to 4 microns or more.

An important factor in determining the interpore distance will be the integrity of the supporting structure. The thickness will likely be thinner (i.e., pore length will be shorter) when there is another support structure which the porous structure is on. For example, the porous aluminum oxide structure may be on a sapphire, diamond, or silicon sheet that provides structural integrity. For an aluminum oxide structure only (i.e., no additional supporting structure), a thickness from about 25 microns to about 100 microns should provide sufficient support.

When a support structure is used, a conductive material such as metal such as gold, titanium, palladium, platinum, or other metal may be deposited at a junction of the support structure the pores. This conductive material will be helpful in attaching or contacting a carbon nanotube to the support structure, especially when the support structure is an insulator or semiconductor or if the electrical contact is insufficient. Only a relatively small amount of conductive material may be needed to aid in nanotube adhesion or electrical contact, or both. The conductive material will not necessarily form a rectifying junction (e.g., carbon nanotube-nanowire) as will be discussed later in this patent.

FIG. 8 shows pores arranged in a hexagonal pattern. Each pore is at a vertex of a hexagon, and there is also one pore in the center of the hexagon. This pattern is repeated throughout the porous structure. Any other competent pattern may also or instead be used. For example, the pores may be arranged in a triangular, square, rectangular, pentagonal, octagonal, trapezoidal, or regular structure. In other embodiments of the invention, the pores may be distributed in a random arrangement. There may be two or more different arrangements of pores in the same porous structure. For example, one portion of the structure has a hexagonal pattern and another portion has an octagonal structure. This may be useful in providing two or more carbon nanotube transistors on the same structure with different characteristics.

Further, there may be different arrangements of the same pattern in the same porous structure. For example, there may be two hexagonal patterns on the same porous structure, but the hexagonal patterns may have some offset from each other. One hexagonal pattern may be shifted some linear distance from the other. Or one hexagonal pattern may be rotated at an angle compared to the other hexagonal pattern.

For a hexagonal pattern, a pitch is calculated by taking the square root of (1/(sine 60*density of pores)). The pitch is the distance between two pores and is therefore a way to estimate the pore diameter, which should be less than the pitch since the structure will have a certain wall thickness for sufficient structural integrity. In an embodiment, a pore diameter will range from about 20 nanometers to about 35 nanometers. In another embodiment, the pore diameter will range from about 15 nanometers to about 50 nanometers. In another embodiment, the pore diameter will range from about 5 nanometers to about 250 nanometers.

The structure may be made by any competent method such as electrochemical anodized etching of aluminum. The length and density of the pores is determined by anodization conditions including voltage and time. Pores can be widened after fabrication by chemical techniques such as phosphoric acid etching at a variety of temperatures such as, for example, room temp, 60 degrees Celsius, and other temperatures. Other chemical techniques include using chromic acid or a combination of chromic and phosphoric acid.

The pattern of pores in the structure may be made by transfer from a porous structure that is primarily made of aluminum oxide and that has been made porous as discussed elsewhere in this patent. The transfer of pore patterns can be by any competent method such as by using the porous aluminum oxide structure as a mask and etching through the pores into the other medium such as into the silicon, silicon germanium, and so forth. As will be discussed in more detail below, the single-walled carbon nanotubes are then synthesized directly within or are transferred to the pores of the new medium. Source, drain, and gate electrodes are defined to form a carbon nanotube transistor of the invention.

In an embodiment, aluminum is the starting substrate material. And this aluminum precursor may be 99.99 percent pure or better. The more pure the aluminum precursor is the better the results generally will be in terms of transistor yield and transistor characteristics.

Before pore fabrication, the precursor is cleaned and annealed. Typically the aluminum is electropolished for some time. Then the substrate is anodized or oxidized to form aluminum oxide where a first layer of pores is created. This first layer of pores does not have to be too organized and consistent; this layer may be removed by chemical means. Then the substrate may be anodized or oxidized again. This second stage of pore fabrication is then used to make a regular arrangement of quality pores. Even more anodization steps may be performed to further improve ordering.

In an embodiment of the invention, when the aluminum is formed on a substrate, electropolishing may not be needed and instead, cleaning will be used, or cleaning and annealing will be used. Electropolishing may remove too much aluminum, and so it may not work well with evaporated or sputtered films of aluminum. These techniques form a relatively thin film of aluminum. With such a thin film, typically there is not sufficient control during the electropolishing process to ensure not too much aluminum is removed. However in the case of bulk aluminum or aluminum foil, then the process may include annealing and electropolishing during anodization. A second anodization, after the first, is optional. Decent pore formation may occur without the second anodization. However, the second anodization is useful in order to avoid steps such as electropolishing.

This process makes pores with one side exposed and a thin barrier layer of aluminum oxide film on the remaining aluminum bulk or substrate on the other end of the pore. In some embodiments, some processes may have no barrier layer when a substrate is used instead of bulk aluminum. The aluminum bulk can be etched or removed by a chemical means to open the other side of the pores. This will leave the aluminum oxide film with a thickness defined by the etching conditions (i.e., time). It is usually about a micron to tens of microns in thickness.

Figure 10:
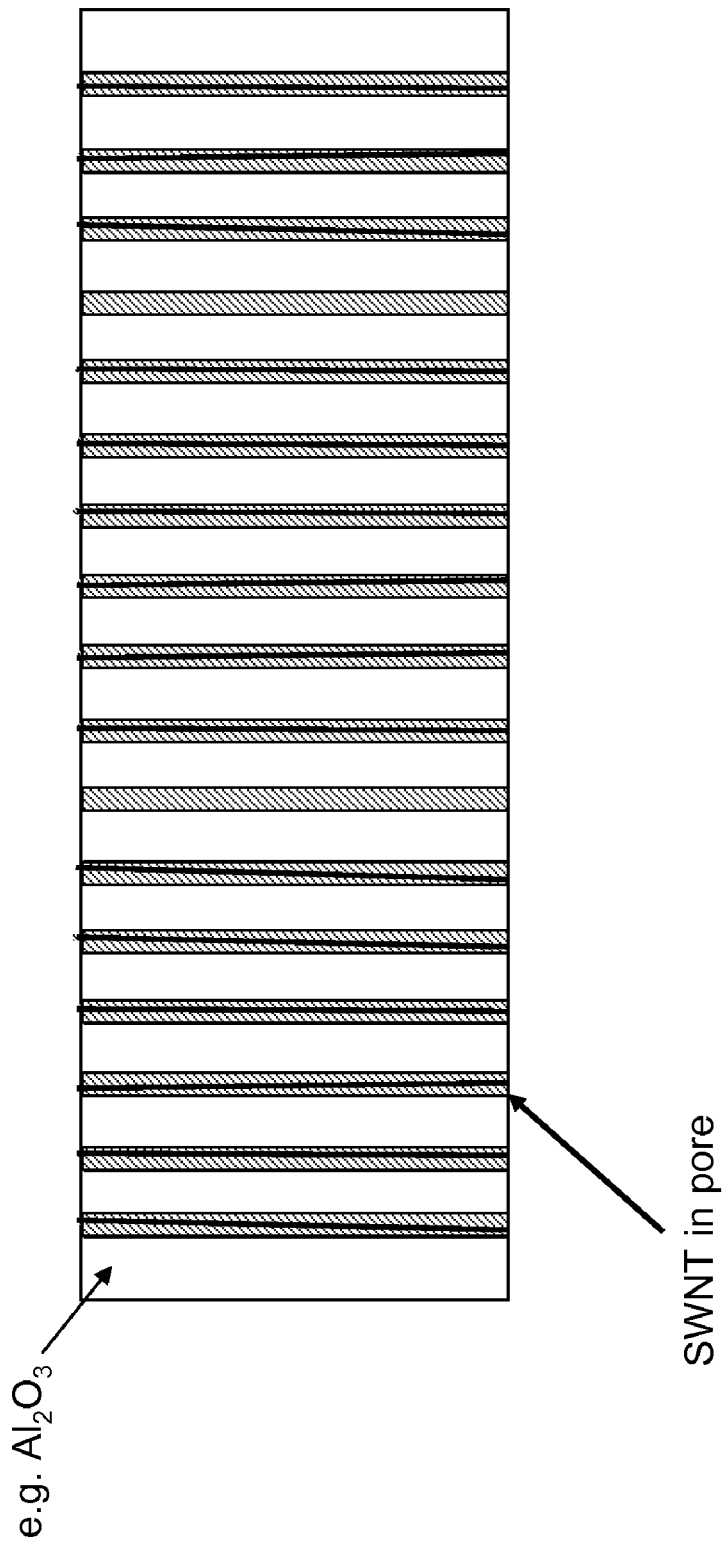
FIG. 10 shows a cross-sectional view of a substrate or structure with pores having single-walled carbon nanotubes.

FIG. 10 shows the porous structure with single-walled carbon nanotube in the pores. Through processing as discussed in more detail below, single-walled carbon nanotubes are formed in the pores. Single-walled carbon nanotube can be synthesized within the pores or transferred to the pores. It is desirable to have a semiconducting single-walled carbon nanotube in each pore. It is also desirable to have a single-walled carbon nanotube that has both ends exposed at or outside the pore in order to make metal connections. Therefore, the single-walled carbon nanotube length should be at least about equal to the pore length.

As is typical for any manufacturing process, however, the yield of semiconducting single-walled carbon nanotubes meeting the desired characteristics will vary. A single-walled carbon nanotube will form in most of the pores, but not necessarily every pore. Each pore may not contain a nanotube due to yield per pore issues. Most likely, the pore will have an average of one tube, but it will be spread out with some with zero tubes, some with one, some with multiple tubes, such as two to four tubes. And for the single-walled carbon nanotubes that are formed, some will have the desired characteristics and others will not.

The single-walled carbon nanotube can be p-type such as when subject to ambient and oxygen adsorption occurs. The single-walled carbon nanotube can be n-type such as when the single-walled carbon nanotube is coated with electron-donating species such as metal particles, select polymer coatings, or select gas species.

Some amounts of missing or defective pores and missing or noneffective single-walled carbon nanotubes are expected. Additionally, some pores and carbon nanotubes may be removed when forming a gate of the transistor. However, due to redundancy and a large number of pores with nanotubes per unit area, an operative transistor will be formed even if not every pore has an effective single-walled carbon nanotube device.

Some nanotubes may have undesirable characteristics. For example, some nanotubes may be metallic single-walled carbon nanotubes or semiconducting single-walled carbon nanotubes that do not deplete effectively with the electric gating. These undesirable carbon nanotube devices can be removed by any competent technique such as chemical, mechanical, or electrical techniques, and the like, or combinations of these techniques. One specific technique is to use acids such as nitric acid to etch metallic tubes at a faster rate than semiconductors. Another technique is electrical burn-off with protection where the gate is used to turn off the "wanted" semiconducting tubes and then flow a sufficient current through the metallic tubes until they fail. The current to cause failure or electrical breakdown of the undesirable carbon nanotubes may be over above about 15 microamps to about 25 microamps per tube, or even higher currents may be used. Due to the redundancy and device density, even in the case when not all pores yield an effective single-walled carbon nanotube device, this will not render the transistor device defective or inoperative.

In some embodiments of the invention, high current densities are obtained. For example, some embodiments of the present invention can be configured by including sufficient density of functional single-walled carbon nanotubes to obtain current density of greater than about 1000 amperes per square centimeter. Depending on the density and current contribution of each carbon nanotube, the current density may be greater than 1000 amperes per square centimeter, such as 2000 amperes per square centimeter, 3000 amperes per square centimeter, 4000 amperes per square centimeter, or 5000 or more amperes per square centimeter. The current density may be less than 1000 amperes per square centimeter. The current density may be much higher than 5000 amperes per square centimeter, such as $10^{11}$ amperes per square centimeter.

Direct synthesis of single-walled carbon nanotubes within the pores can use any competent method. In an embodiment of the invention, a technique includes performing chemical vapor deposition (CVD) at 400 degrees to 1200 degrees Celsius to synthesize single-walled carbon nanotube devices within the pores. The results may be that about 95 percent or higher of the single-walled carbon nanotubes are semiconducting. In another embodiment, 70 percent or higher of the single-walled carbon nanotubes are semiconducting. However, lower percentages such as at least 60 percent or lower can also be tolerated to obtain a working device.

In another embodiment of the present invention, a method is as follows. Fabricate pores in the in the form of aluminum oxide film on the aluminum bulk. In an embodiment, the pores and aluminum oxide are formed at the same time as the aluminum is being oxidized. Place an appropriate catalyst at the bottom of the pores to form single-walled carbon nanotubes. The appropriate catalyst may be, for example, iron, nickel, or cobalt, or any combination of these metals, or any combination of one or more of these with other metals. Typically the catalyst is in the form of nanoparticles that is the appropriate size, usually 1 nanometer to 4 nanometers in diameter. In other implementations, the catalyst may be larger than 4 nanometers. These nanoparticles may be obtained through metal deposition such as by metal evaporators, electrochemical deposition of metals, or a wet deposition of catalyst where the metal catalyst nanoparticle or particles is supported by a larger inorganic support or an organic shell, such as a ferritin protein.

The catalyst particle should stay the appropriate size for synthesis of the single-walled carbon nanotubes. Synthesis can occur with the aluminum bulk still on the bottom of the structure if temperatures are less than about 600 degrees Celsius to about 650 degrees Celsius. The template with aluminum oxide only can go to higher temperature, for example, to about 900 degrees Celsius to about 1000 degrees Celsius. Above 650 degrees Celsius the aluminum will begin to melt, and below 600 degrees Celsius, carbon nanotube production may be impaired compared to production at a higher temperature. The presence of remaining aluminum bulk limits the maximum temperature. Otherwise a full range of about 400 degrees Celsius to about 1200 degrees Celsius may be used. As an example, if a different material is used, such as tungsten, a higher temperature than 650 degrees Celsius may be used because the melting point of the material is higher than aluminum.

In an embodiment, the aluminum bulk will be removed, which will leave a thin aluminum oxide film on the bottom side, such that the catalyst particle is not exposed (or the single-walled carbon nanotubes will grow from that side and not into the pore itself). After synthesis, the thin aluminum oxide film or bulk aluminum is removed and the aluminum oxide membrane will have the ability to metal connect to each side of the single-walled carbon nanotube.

In another embodiment of the invention, single-walled carbon nanotubes are synthesized before incorporation into the transistor device. The single-walled carbon nanotubes are synthesized beforehand in bulk by any competent method such as CVD, arc-discharge, laser ablation method, or the like, or combinations of these, or any other method. Then the carbon nanotubes are transferred into the pores of the structure. The transfer method of single-walled carbon nanotube placement can use any competent method.

In one embodiment of the present invention, a method is as follows. Fabricate pores and the aluminum oxide film, and then remove the aluminum bulk and expose each side of the pores. As discussed above, in an embodiment, the pores and aluminum oxide may be formed at the same time as the aluminum is being oxidized. Synthesize the single-walled carbon nanotubes. Then the single-walled carbon nanotubes are put in solution or suspension by any competent method. Flow a solution or suspension containing single-walled carbon nanotube through the pores such that it leaves single-walled carbon nanotubes in the pores with the ability to contact each side with metal electrodes.

More specifically, single-walled carbon nanotubes in solutions or suspensions are transferred to the pores as the liquid flows through the pores. Microfluidic methods may be used. Any unwanted or extraneous single-walled carbon nanotubes or portions of single-walled carbon nanotubes are removed by any competent method such as chemical, electrical, or mechanical methods, or the like.

While in solution, the single-walled carbon nanotubes can further be separated to enrich the semiconducting content and optimize the length and diameter. For example, the single-walled carbon nanotubes may be separated by size, length, or electrical characteristics. In one implementation, semiconducting single-walled carbon nanotubes are separated from metallic single-walled carbon nanotubes. Therefore, using this approach, it is possible to get a higher concentration of semiconducting single-walled carbon nanotubes than is possible by synthesis alone. The solution or suspension can also be optimized for single-walled carbon nanotubes of a desired diameter and length. The diameter of the single-walled carbon nanotube will determine the semiconducting band gap size. The length of the single-walled carbon nanotubes should be at least as long as the pore length.

Source and drain electrodes may be formed on each side (e.g., top and bottom) of the single-walled carbon nanotubes and aluminum oxide structure. To help open both sides of an aluminum oxide structure and the single-walled carbon nanotube for electrode connection, any barrier aluminum or aluminum oxide is removed by any competent method. One or more gate electrodes is fabricated to form the transistor.

Figure 11A:
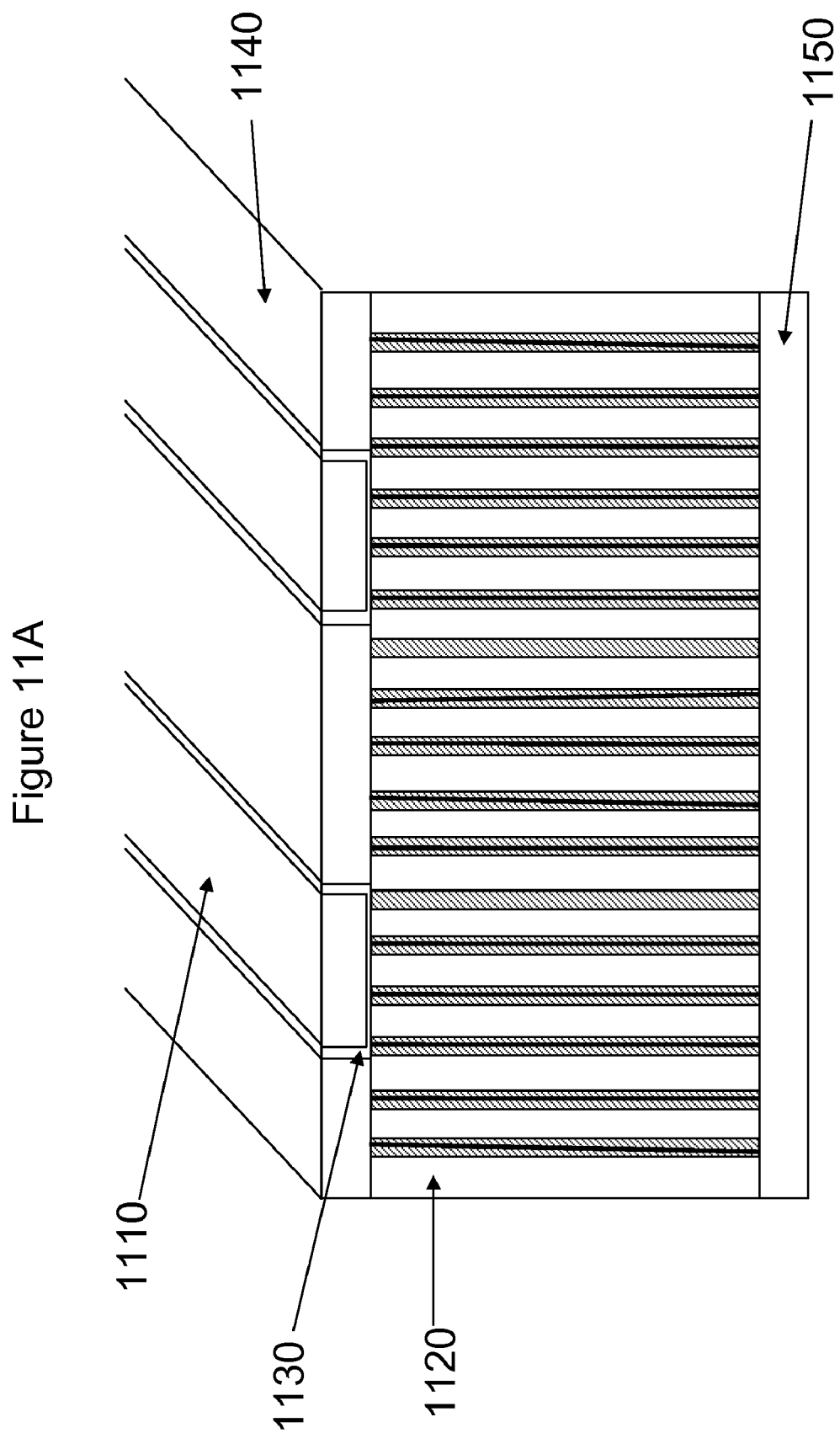
FIG. 11A shows a perspective view of a single-walled carbon nanotube transistor device of the invention.

FIG. 11A shows a perspective view of a transistor according to an embodiment of the invention. Although FIG. 11A shows one transistor according to the invention, using the technique of the invention, many transistors may be formed at the same time. Only a single transistor is shown in order to simplify the diagram.

One side of the porous structure 1120 is connected with a conductive electrode 1140 and is a source electrode for the transistor. The opposite side is connected with a conductive electrode 1150 and is a drain electrode for the transistor. A conductive gate region 1110 is patterned such that it is isolated by an oxide or other isolating material 1130 from the source and drain and the carbon nanotubes. In an embodiment, oxide 1130 is aluminum oxide. This gate effectively gates the multiple single-walled carbon nanotube connections. This gate may be formed using metal, polysilicon, polysilicide, or another conductive material.

This patent describes top electrode 1140 as the source node of the transistor while bottom electrode 1150 is the drain node of the transistor. However, in other implementations of the invention, as those of skill in the art will recognize, these designations may be exchanged, so top electrode may be the drain and bottom electrode will be the source. Therefore, although this patent primarily describes one particular arrangement of electrodes for consistency, other arrangements may be used instead without departing from the scope of the invention.

A layout of the top side of the porous structure has are stripes of alternating types of conductors. In this specific case, the conductors are source, gate, source, gate, and source. Alternatively, the stripes may be drain, gate, drain, gate, and drain. In an implementation, these conductors may be metal, polysilicon, metal, polysilicon, and metal.

In another embodiment, a layout of the bottom side of the structure may mirror the stripe arrangement of the top. For example, the top may be source, gate, source, gate, and source, and the bottom may be drain, gate, drain, gate, and drain, where gates on the top are above the gates on the bottom. Another arrangement on the bottom is gate, drain, gate, drain, and gate, where the sources on top are above the gates on the bottom.

In a further embodiment, source electrodes and drain electrodes may be integrated on the same side of the structure. For example, the drain electrodes on the top side of the structure may be connected to ends of the nanotubes on the bottom through an appropriate connection such as a jumper, via, carbon nanotube, or nanowire.

In the embodiment of FIG. 11A, the transistor has two gate electrodes or two gate electrode regions 1110, and between these regions are a number of pores and single-walled carbon nanotubes. The figure shows five pores and four single-walled carbon nanotubes between the gate regions. However, in other embodiments of the invention, there may be even greater numbers of pores and single-walled carbon nanotubes between the gate electrodes. There may be less than four single-walled carbon nanotubes between the two electrodes, such as two or three single-walled carbon nanotubes.

Gate regions 1110 may be separate and independent of each other. This means a different or the same voltage may be applied to each, independently of the other. Or the regions may be electrically connected or otherwise strapped together elsewhere in the structure (not shown) and act together essentially as a single, but distributed gate electrode. A gate electrode portion shown would be like one of the three "fingers" or extensions of a capital "E." In a transistor of the invention, there may be any numbers of such fingers of the gate electrode, such as more than two, three, four, five, or even hundreds or thousands of such gate regions. Therefore, gate 1110 may be referred to as gate region, gate member, gate portion, gate segment, gate parcel, or gate piece, where each region may be separate and independent of other regions, or one region may be electrically connected to one or more other regions.

There are three source regions 1140. Similar to the case for gate 1110, the source and drain regions may be separate and independent of each other. Or the source and drain regions may be electrically connected or otherwise strapped together elsewhere in the structure (not shown) and act together essentially as a single, but distributed source or drain electrode. In a structure, there may be any number of source or drain regions.

More specifically, the source is on one side of the porous structure such as the aluminum oxide structure and connects with one end of single-walled carbon nanotubes. The drain is on the other side of the porous structure and connects with the other end of the single-walled carbon nanotubes. The single-walled carbon nanotubes are then electrically connected and can function as a current carrying device or channel.

In an implementation of the invention, the gate regions of the structure are connected together, the source regions are connected together, and the drain regions are connected together. This arrangement may be thought of as single-walled carbon nanotubes connected and operating in parallel. There may be hundreds, thousands, hundreds of thousands, millions, or more carbon nanotubes that are combined to form a single-walled carbon nanotube transistor of the invention.

In an embodiment of the invention as shown in FIG. 11A, the gate electrode is fabricated either on one side or both sides of the aluminum oxide structure. For example, a gate electrode layer may be formed on the source layer or the drain layer, or on both sides. In this implementation, the nanotubes would be "sandwiched" between the source and drain electrodes, and some nanotubes would be below the gate electrodes. Or the nanotubes may be sandwiched between two gate electrodes on opposite ends. Alternatively, when gates are on both sides of the structure, the gates may be patterned in an alternating drain-gate-source-type structure so carbon nanotubes are not sandwiched between the gate electrodes.

These nanotubes would not electrically contact the gate electrode because of the insulating layer. And the gate electrode or electrodes are electrically isolated from the source and drain electrodes, perhaps by use of an insulating layer between a gate electrode layer and a source (or drain) electrode layer.

Figure 11B:
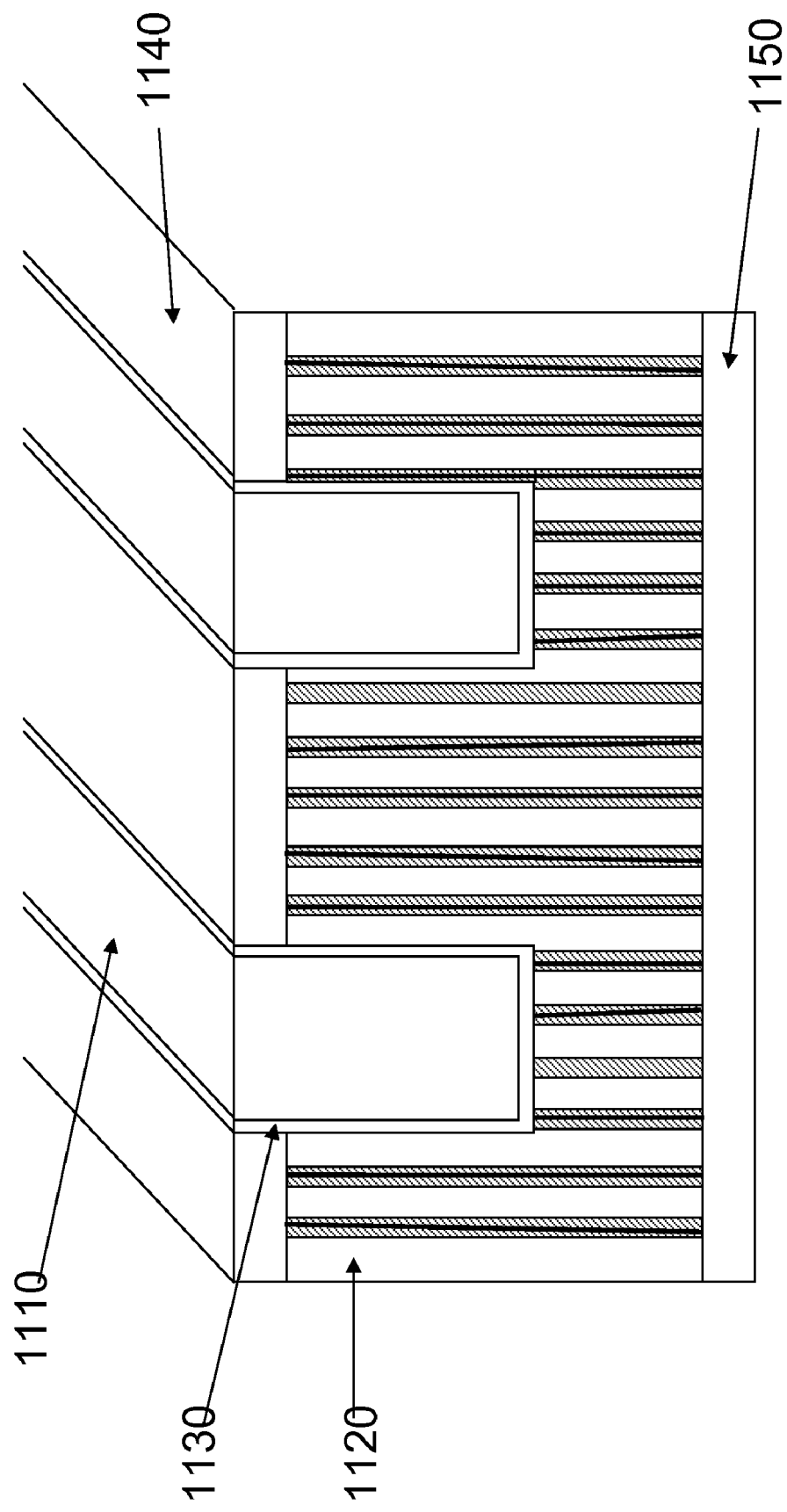
FIG. 11B shows a perspective view of a single-walled carbon nanotube transistor device of the invention, where a gate electrode extends into the structure.

Another embodiment of the invention is shown in FIG. 11B. This implementation is similar to the one shown in FIG. 11A. However, gate region 1110 is etched, deposited, or otherwise formed into the aluminum oxide structure so as to be more effective at gating the length of the single-walled carbon nanotubes. A depth of the gate region may be the entire length of the porous structure (e.g., through the source electrode and up to or adjacent the drain electrode), or the depth may be any portion of the length of the porous structure. For example, the depth of the gate may be 5 percent, 10 percent, 20 percent, 30 percent, 40 percent, 50 percent, 55 percent, 60 percent, or a greater percentage of the length of the porous structure. The depth may be less than 20 percent, less than 30 percent, less than 40 percent, less than 50 percent, and other percentages.

When processing a device of the invention, a conductive layer if formed on a surface of the porous structure. This conductive layer may be for the source or drain electrode region. The conductive layer may be patterned to etch openings for the gate. To etch an aluminum oxide structure with pores, a reactive ion etcher (RIE) may be used. A reactive ion etcher is a form of dry etching. One example for the gases used for reactive ion etching is argon. Another example is argon and $SF_6$. The gases used may be argon, fluorides (like $SF_6$), or chlorides, oxygen, or combinations of these.

For the distances or depths etching into the porous structure, in one embodiment, the trench depth is about 5 nanometers or 50 Angstroms. If the total thickness is 1 micron or 10,000 Angstroms, 50 Angstroms would be a depth of 0.5 percent. In such an embodiment, the trench depth would be at least 0.5 percent. In another embodiment, the depth will be about 10 nanometers, 100 Angstroms, or a one percent depth. In another embodiment, the depth will be about 50 nanometers, 500 Angstroms, or a five percent depth. In another embodiment, the depth will be about 100 nanometers, 1000 Angstroms, or a ten percent depth. In a further embodiment, the depth will be about 500 nanometers, 5000 Angstroms, or a fifty percent depth. In a further embodiment, the depth will be about 1000 nanometers, 10,000 Angstroms, or a one-hundred percent depth.

The etch rates may be dependent on the trench size or more particularly, a width of a line. Smaller lines or openings may etch more slowly than larger ones, so this will affect the depths versus lithography line dimensions.

Also, the gate region is shown as a rectangular shape in FIGS. 11A and 11B. However, in other implementations of the invention, the gate may be in any shape such as a polygon, triangle, trapezoid, circle, ellipse, oval, or some combination of shapes.

Furthermore, according to a technique of the invention, the trench is formed into the porous structure by etching by chemicals, plasma, laser, mechanical means, micro-electromechanical systems (MEMs), or other technique. An isolating material is deposited in the trench such as aluminum oxide, silicon oxide, zirconium oxide, hafnium oxide, or another insulating material. This insulating material will prevent the gate material from shorting out any carbon nanotubes. Then gate material 1110 is deposited in the trench. The gate material may be deposited using sputtering, evaporation, or other technique.

Another consideration for selecting a gate depth is the type of transistor being fabricated. If the device is a depletion mode transistor, the depth of the gate may be less than if the device is an enhancement mode transistor. This is because a depletion mode transistor is normally on. Therefore, to turn the depletion mode transistor off, the gate has to turn off any relatively small portion of the channel or single-walled carbon nanotube. In contrast, for an enhancement mode transistor, the gate should turn on the entire channel for the transistor to be fully on.

After device fabrication, the single-walled carbon nanotube transistor device is mounted and packaged in order to achieve overall mechanical, electrical, and thermal quality and stability as a final product.

In operation, a voltage is applied to the gate electrode to modulate the electrical properties of the semiconducting single-walled carbon nanotubes. The gate electrode is placed near enough in proximity to the single-walled carbon nanotubes in order to be an effective gate. In some embodiments of invention, an effective gate for the transistor will be just a portion of the semiconducting single-walled carbon nanotubes—that is, the portion nearest the gate electrode. In other words, when a voltage is applied to the gate, there will be an electric field in the porous structure. The field strength of this electric field will decrease as a distance from the gate increases. Therefore, single-walled carbon nanotubes that are closer to the gate will be more influenced by the gate.

Depending on the characteristics of the semiconducting single-walled carbon nanotubes, the transistor may be enhancement, depletion, native, or other type of transistor. This will adjust the characteristics of the transistor. For example, a depletion mode single-walled carbon nanotube transistor passes current until it is turned off, while an enhancement mode single-walled carbon nanotube transistor normally impedes current until it is triggered to turn on. To obtain the desired transistor characteristics, the single-walled carbon nanotubes may be adjusted during the processing. For example, the carbon nanotubes may be doped with certain ions or absorbed molecules to adjust their characteristics.

In an embodiment, the pores may be filled after tube growth. For example, in an embodiment where the single-walled carbon nanotubes do not fill the entire pore, the remaining area within the pores may be partially or completely filled with a material. Examples of the material may be an insulator, metal, semiconductor, or polymer. This material may be used to passivate, protect, stabilize, or modify, or combinations of these, the properties of the carbon nanotubes. For example, a polymer may be used to coat the nanotubes to give the nanotubes a particular type of doping. Also, the polymer may be chemically modified during processing.

In a further embodiment, a material may be added to fill in at least some portion of the open area within the pores. In particular, as discussed above, the single-walled carbon nanotube is smaller than a diameter than the pore. This "empty" space between the nanotube and pore walls may be filled or coated with a material such as an insulator, metal oxide, polymer, or other material.

The empty space may be filled with multiple materials or layers of different materials. One layer may be an insulator, metal oxide, polymer, or other nonconducting layer. Another layer may be a metal, semiconductor, polysilicon, polymer, or other conducting layer. The nonconducting layer would be considered nonconducting relative to the conducting layer. The insulator would insulate the single-walled carbon nanotube from other materials, which may be conductive materials. There may be two, three, four, five, six, seven, eight, or more layers within each pore. Some of the layers may be the same of different, in any combination as desired. For example, the layers may alternate between conductive and nonconductive.

Using multiple concentric layers of different material, individual pores may be used to form a transistor device. In a pore will be a single-walled carbon nanotube, which will serve as a channel region of the transistor. Surrounding at least a portion of the single-walled carbon nanotube will be a relatively thin insulating layer such as an oxide. Further, surrounding this oxide will be a conductive layer such as metal, polysilicon, other conductor. This layer will serve as a gate electrode of the transistor. In such an embodiment of the invention, the pore diameters are selected to permit the multiple layers to be fabricated and connected to, and the pore density will be affected accordingly. The porous structure may have many numbers of these transistors, and each may be operated independently of another, or two or more of the transistors may be connected together. Or a group or all the transistors of the porous structure may be connected together to be operated as a single large transistor.

In a specific embodiment, the single-walled carbon nanotube are formed or placed in the pores before forming the layers. Single-walled carbon nanotubes are synthesized or transferred to uncoated pores. The single-walled carbon nanotubes are isolated with oxide or similar insulator. Then the gate material is added. The source or drain, or both, may be contacted before or after the gate if added.

Furthermore, the single-walled carbon nanotube may be resting in place on one side of the pore walls. Then, the insulating layer and any other layers will fill the pore and almost surround the entire length of the nanotube, but not the part of the nanotube that is in contact with the original porous structure. If desirable, the portion of the nanotube that is touching the porous structure may be removed. For example, this portion may be removed by etching, chemical mechanical polishing, electropolishing, grinding, or other removal techniques. What will be left will be the one or more layers and the single-walled carbon nanotube without the portion touching the porous structure.

In another specific embodiment, the single-walled carbon nanotubes are formed or placed in the pore after the layers are formed. To fabricate this embodiment of the invention, one technique is, after fabricating the pores, to form in or coat the pores with a conductive material, which will become the gate. Then an insulating coating is added, which will be the gate oxide. Then single-walled carbon nanotubes are synthesized or transferred, in a fashion as discussed elsewhere in this patent, to the coated pores. Connections will then be made to the transistors.

Two or more single-walled carbon nanotube transistors may be manufactured on the same porous structure. These single-walled carbon nanotube transistors on the same structure may operate independently of each other, or may be electrically connected to each other in some fashion to form a circuit, an integrated circuit of single-walled carbon nanotube transistors. Single-walled carbon nanotube transistors of the invention may be integrated with other devices which do not include carbon nanotubes, such as NMOS, PMOS, or BJT transistors, diodes, resistances, capacitances, inductances, impedances, and others formed on the same porous structure, or the devices without carbon nanotubes may be on a separate structure, such as a semiconductor substrate. The semiconductor substrate may be silicon or gallium arsenide. These separate structures (which may be referred to as dies) may be packaged together in a single package, or may be separately packaged.

Figure 12:
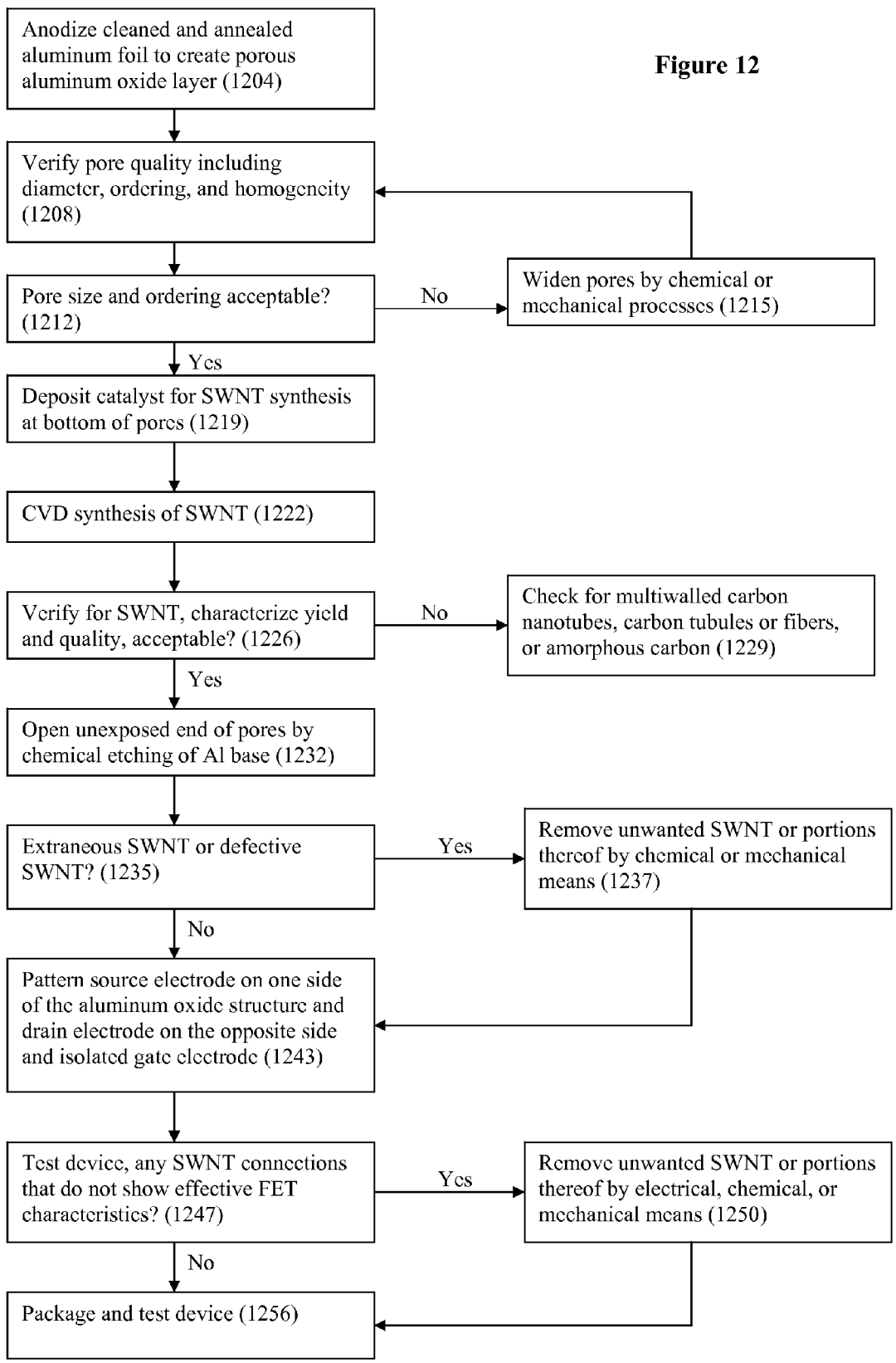
FIG. 12 shows a flow diagram of a technique for fabricating a single-walled carbon nanotube transistor device using chemical vapor deposition (CVD) synthesis.

FIG. 12 shows a flow diagram of a direct synthesis method for single-walled carbon nanotube placement, according to a specific embodiment of the present invention. In a step 1204, the technique anodizes cleaned and annealed aluminum foil to create a porous aluminum oxide layer. The starting aluminum material may be of any thickness, not only in foil form. The starting aluminum material or aluminum substrate may be thicker than aluminum foil. As was discussed above, another material besides aluminum may be used as the starting material.

In a step 1208, verify pore quality including diameter, ordering, and homogeneity. In a step 1212, check whether pore size and ordering is acceptable. These may be checked by atomic force microscopy (AFM), scanning electron microscopy (SEM), ellipsometry, or other characterization techniques, or combinations of these. If not, then in a step 1215, widen pores by chemical or mechanical processes. A second anodization may be performed after removing the first pore structure in order to increase ordering. The substrate may be dipped in a chemical solution such as phosphoric acid, chromic acid, or combinations of these at a variety of temperatures, which will etch the pores to have a larger diameter.

Once the pore size and ordering is acceptable, the technique proceeds to a step 1219 to deposit catalyst for single-walled carbon nanotube synthesis at bottom of pores. Some examples of catalysts include iron (Fe), nickel (Ni), cobalt (Co), molybdenum (Mo), or combinations of these by electrodeposition, sputtering, evaporation, or metal nanoparticles in the form of ferritin. The catalyst may be an alloy of iron, nickel, or cobalt.

The catalyst permits the carbon nanotubes to form under the following conditions: temperatures from about 400 degrees Celsius to about 1200 degrees Celsius; hydrocarbon gas or carbon containing species, or combination of these, in reactor or flowing through reactor. One example of conditions to grow carbon nanotubes is to use methane and hydrogen at about 800 degrees Celsius to about 850 degrees Celsius. In a further embodiment, to grow carbon nanotubes, a temperature from about 600 degrees Celsius to about 900 degrees Celsius is used.

In a step 1222, perform chemical vapor deposition synthesis of single-walled carbon nanotubes. In a step 1226, verify acceptability of the single-walled carbon nanotubes. Characterize yield and quality. If not acceptable, proceed to a step 1229, check for multiwalled carbon nanotubes, carbon tubules or fibers, or amorphous carbon. If there are multiwalled or tubules or amorphous carbon, then the sample will probably not be useable and the processing will starts over. For example, information about what happened to the present run through the process may be used to fine tune the process in further runs. Adjustments may be made to the synthesis conditions such as reducing the amount of reactive carbon and perhaps change or reduce the amount of catalyst.

If after step 1226 the single-walled carbon nanotube are acceptable, then proceed to step 1232, open unexposed end of pores by chemical etching of aluminum base.

In a step 1235, check whether there are extraneous single-walled carbon nanotubes or defective single-walled carbon nanotubes. If not, proceed to step 1243, otherwise proceed to step 1237 to remove unwanted single-walled carbon nanotubes or portions of these by chemical or mechanical means. For example, selective etching of extraneous nanotubes by plasma etching or acid treatment, possibly in conjunction with lithographic patterning for protection of wanted tubes may be used.

Then proceed to step 1243, to pattern a source electrode on one side of the aluminum oxide structure, drain electrode on the opposite side, and isolated gate electrode. During this step, the single-walled carbon nanotube transistor is formed.

In a step 1247, test the transistor device. Determine if any single-walled carbon nanotube connections do not show effective field effect transistor characteristics. If not, proceed to step 1256, otherwise in step 1250, remove unwanted single-walled carbon nanotubes or portions of these by electrical, chemical, or mechanical means. A technique such as the electrical burn-off technique discussed may be used.

In step 1256, the transistor device is packaged and tested.

Figure 13:
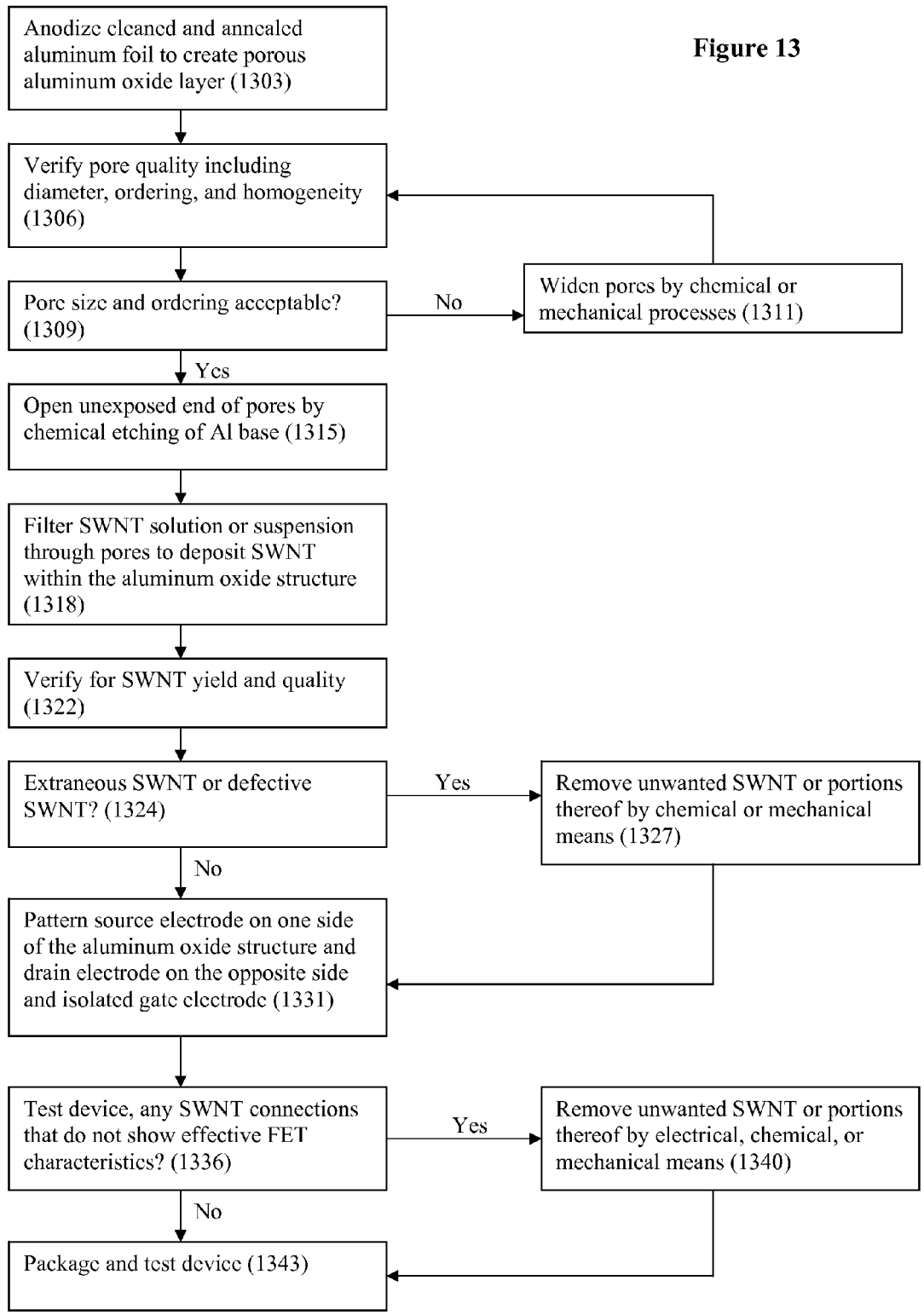
FIG. 13 shows a flow diagram of a technique for fabricating a single-walled carbon nanotube transistor device using a liquid deposition.

FIG. 13 shows a flow diagram of a transfer method for single-walled carbon nanotube placement, according to a specific embodiment of the present invention. In a step 1303, the technique anodizes cleaned and annealed aluminum foil to create a porous aluminum oxide layer. The starting aluminum material may be of any thickness, not only in foil form. The starting aluminum material or aluminum substrate may be thicker than aluminum foil. As was discussed above, another material besides aluminum may be used as the starting material.

In a step 1306, verify pore quality including diameter, ordering, and homogeneity. In a step 1309, check whether pore size and ordering is acceptable. These may be checked by atomic force microscopy (AFM), scanning electron microscopy (SEM), ellipsometry, or other characterization techniques, or combinations of these. If not, then in a step 1311, widen pores by chemical or mechanical processes. A second anodization may be performed after removing the first pore structure in order to increase ordering. The substrate may be dipped in a chemical solution such as phosphoric acid, chromic acid, or combinations of these at a variety of temperatures, which will etch the pores to have a larger diameter.

Once the pore size and ordering is acceptable, the technique proceeds to a step 1315 to open unexposed end of pores by chemical etching of aluminum base. In a step 1318, filter single-walled carbon nanotube solution or suspension through pores to deposit single-walled carbon nanotubes within the aluminum oxide structure. In a step 1322, verify for single-walled carbon nanotube yield and quality.

In a step 1324, check whether there are extraneous single-walled carbon nanotubes or defective single-walled carbon nanotubes. If not, proceed to step 1331, otherwise proceed to step 1327 to remove unwanted single-walled carbon nanotubes or portions of these by chemical or mechanical means. For example, selective etching of extraneous nanotubes by plasma etching or acid treatment, possibly in conjunction with lithographic patterning for protection of wanted tubes, may be used. Then the next step is 1331.

In step 1331, pattern a source electrode on one side of the aluminum oxide structure, drain electrode on the opposite side, and isolated gate electrode. During this step, the single-walled carbon nanotube transistor is formed.

In a step 1336, test the transistor device. Determine if any single-walled carbon nanotube connections do not show effective field effect transistor characteristics. If not, proceed to step 1343, otherwise in step 1340, remove unwanted single-walled carbon nanotubes or portions of these by electrical, chemical, or mechanical means. The electrical burn-off technique discussed above may be used.

In step 1343, the transistor device is packaged and tested.

Various embodiments and implementation of the invention are provided below. An example embodiment of the present invention is a method for making a transistor or power transistor that includes the following. Aluminum is anodized and holes are formed in the aluminum oxide. One end of the aluminum oxide will be open. A catalyst is put at the bottom of holes. At a temperature under about 650 Celsius, single-walled carbon nanotubes are grown from the bottom of holes to the top and possibly extending out of the top. It is desirable to have one single-walled carbon nanotube per hole or pore. Bulk aluminum and any thin film of alumina are removed to expose the bottom of holes and the resultant single-walled carbon nanotubes. Added are a drain to one side and source to one side of the material with holes. A gate is added to one or more sides of the material with holes. In another embodiment, etch or create a trench to place the gate into the aluminum oxide.

Note that adding one of the electrodes (drain or source) to the top side may be performed before or after the step of removing the bulk aluminum. Adding the gate to the top side can be performed before or after the step of removing the bulk aluminum.

A protector or insulator film can be added to help isolate the gate. The protector film can be performed before adding the gate and can be performed before removing the bulk aluminum.

For this and other method embodiments, that if the material for the holes is not to be aluminum oxide, then the hole-making steps to be used would be any competent hole-making steps for the particular material chosen.

In a further embodiment, the present invention is a method for making a power transistor that includes the following. Anodize aluminum and form holes, where one end is open. Remove bulk aluminum. A thin aluminum oxide may remain which keeps the holes covered. Put catalyst at bottom of holes. Grow single-walled carbon nanotubes (desirable to have one per hole) from the bottom of holes to the top and possible extending out of the top. Remove any thin film of alumina to expose the bottom of holes and the resultant single-walled carbon nanotubes. Add drain to one side and a source to one side. Add gate to one or more sides, or alternatively or in additionally, etch trench or other opening into the aluminum oxide and form gate in trench or opening.

Adding one electrode (drain or source) and the gate to top side (and possibly a protector film) may be performed before the remove bulk aluminum step.

In a further embodiment, the present invention is a method for making a transistor or power transistor that includes the following. Anodize aluminum and form holes, where one end may be open. Remove bulk aluminum and any alumina film to fully expose both ends of holes. Put or position catalyst at one end of holes. By position, this could be by placing the template on another substrate that is covered with catalyst. The single-walled carbon nanotubes could grow up and through the hole. Grow single-walled carbon nanotubes in a further embodiment (desirable to have just one per hole) from one end of hole and through the holes to the other end, possibly extending from the holes. Add a drain to one side and a source to one side. Add gate to one or more sides, or alternatively or in additionally, etch trench or other opening into the aluminum oxide and form gate in trench or opening.

In a further embodiment, the present invention is a method for making a transistor or power transistor that includes the following. Place source on a substrate. Add aluminum layer onto source layer. Anodize holes in aluminum layer to form porous aluminum oxide. Verify that holes reach the source. Verification may include an etch step. Put catalyst on bottom of holes. Grow single-walled carbon nanotubes through holes and possibly extending through the hole. The nanotubes may be electrically connected to source. Add drain and gate.

Note that in this embodiment, the aluminum oxide with pores is directly on a substrate with source already there. The substrate also provided mechanical stability. The alumina film can then be thin and robust. The catalyst can also be placed on the source layer before adding the aluminum layer step.

In another example implementation approach, both ends of the holes are exposed and catalyst is put or positioned at one end of the pore. Single-walled carbon nanotubes then grow from one end of the pore and through the pore to the other end, possibly extending out the end. For instance, the aluminum oxide film with pores can be contacted to a substrate covered with single-walled carbon nanotube catalyst. In another form, the aluminum to be anodized can be deposited or placed on a substrate, which can be used as a form of mechanical stability. A source electrode can be placed between the substrate and aluminum, such that the holes will reach the source. Single-walled carbon nanotube will be contacted electrically to the source during and after synthesis. The catalyst for single-walled carbon nanotube synthesis can be placed on the source before or the formation of the porous aluminum oxide film.

Other embodiments of the present invention are apparatuses or articles produced according to any method embodiment of the present invention or produced using any apparatus or article embodiment of the present invention.

Further example embodiments include the following. A transistor device includes a structure that defines a number of pores. Single-walled carbon nanotubes will be inside at least some of the number of pores. A first electrode on a first side of the structure connects to multiple ones of the single-walled carbon nanotubes. A second electrode on a second (e.g., opposing) side of the structure connects to multiple ones of the single-walled carbon nanotubes. There is a third electrode that is electrically isolated from the first and second electrode.

The first electrode may define the source of the transistor. The second electrode may define the drain of the transistor. The third electrode may define the gate of the transistor. The device operates as a field-effect transistor. The number of pores includes pores with diameters within the range of about 1 nanometer to about 200 nanometers. The structure has pore densities of about $10^6$ per square centimeter to about $10^{14}$ per square centimeter.

In an embodiment, at least a given percentage of pores will be known to contain single-walled carbon nanotubes. Each pore may include zero, one, or multiple single-walled carbon nanotubes. At least about 60 percent of the single-walled carbon nanotubes are semiconducting. In an embodiment, metallic, noneffective, or unwanted single-walled carbon nanotubes have been destroyed, modified, or removed by chemical, mechanical, or electrical techniques.

In an embodiment, the single-walled carbon nanotubes predominantly include p-type semiconducting single-walled carbon nanotubes. In another embodiment, the single-walled carbon nanotubes predominantly include n-type semiconducting single-walled carbon nanotubes. In another embodiment, the p-type and n-type devices are integrated on the same chip. Single-walled carbon nanotubes may be synthesized directly within at least some of the number of pores of the structure. Chemical vapor deposition may be used to synthesize the single-walled carbon nanotubes. An effective catalyst is used to synthesize single-walled carbon nanotubes. The catalyst includes iron (Fe), nickel (Ni), or cobalt (Co), or a combination of these. The catalyst may be an alloy of iron, nickel, or cobalt, or a combination of these.

The single-walled carbon nanotubes predominantly may have diameters from about 0.4 nanometers to about 5 nanometers. In an embodiment, at least a given percentage of single-walled carbon nanotubes are known or estimated to have lengths greater than or about equal to the length of the pores in the structure.

Unwanted single-walled carbon nanotubes, or portions of these, are destroyed, modified, or removed by chemical, mechanical, or electrical techniques. Single-walled carbon nanotubes may have been transferred to the pores of the structure. The single-walled carbon nanotubes, before transfer to the pores, may have been synthesized by chemical vapor deposition, arc-discharge, or laser ablation techniques.

The single-walled carbon nanotubes may have been in solutions or suspensions for use in transfer to the structure. The solution or suspension flowed through the pores in the structure and single-walled carbon nanotubes were deposited within the pores.

In an embodiment, at least a given percentage of single-walled carbon nanotubes have lengths greater than or about equal to the length of the pores in the structure. The single-walled carbon nanotubes may have diameters of from about 0.4 nanometers to about 5 nanometers. Unwanted single-walled carbon nanotubes, or portions of these, may be destroyed, modified, or removed by chemical, mechanical, or electrical techniques.

The gate electrode may be located on one or both sides of the structure. The gate electrode may be partially or completely etched into the structure. In an embodiment, the device is capable of achieving high current densities of at least about 5000 amps per square centimeter.

In an embodiment, the structure is made of a material and the structure's pore pattern was obtained by being transferred onto the structure via a pore-pattern template by chemical, electrochemical, dry etching, or mechanical techniques. The material may be silicon, silicon germanium, gallium nitride, germanium, gallium arsenide, plastic, polymer, glass, or quartz. The pore-pattern template may include aluminum oxide.

In further embodiments, the invention is the use of a carbon nanotube transistor as described in this patent as a power transistor, power amplifier, high current switch, power source for DC or other motors, or general power supply. The invention is the use of a carbon nanotube transistor as described in this patent as a transistor capable of achieving high current densities of at least about 1000 amps per square centimeter. The transistor device may have a structure including aluminum oxide. Other materials may include silicon, silicon germanium, gallium nitride, germanium, gallium arsenide, plastic, polymer, glass, quartz, or combinations of these. The invention is the use of silicon, silicon oxide, silicon nitride, gallium nitride, gallium arsenide, plastic, polymer, glass, quartz, a metal, or combinations of these to form a carbon nanotube transistor as described in this patent.

As a further example, in described embodiments of the invention, a transistor or power transistor device may be configured to obtain a large number or density of single-walled carbon nanotubes, or both of these. For example, a power transistor device can be configured to be greater than nano-sized, greater than one square micron, greater than two square microns, or greater than five square microns, or even larger.

As a further example, the transistor device shown schematically in FIG. 11 shows a small number pores and the gate on one or two sides of the single-walled carbon nanotubes, for illustrative simplicity. More generally, in embodiments of the invention, a single power transistor device may be configured to include more than one thousand pores that contain single-walled carbon nanotubes, more than two thousand, or more than five thousand, or even more, pores that contain single-walled carbon nanotubes. The gate electrode may be configured in any competent configuration. In some embodiments, the gate is arranged such that one gate structure helps to control a number of single-walled carbon nanotubes, including single-walled carbon nanotubes of varying nearest distances to the gate structure. For example, single-walled carbon nanotubes, some of which are at least twice, or at least three times, or at least five times as far from the gate structure as are other single-walled carbon nanotubes, are controlled by the gate structure.

As a further example, in any embodiment of the invention, a transistor or power transistor device according to the embodiment may use a porous structure that is made from any nonconductive, competent material.

Nanostructure Junction Fabrication

In an embodiment, the present invention includes diode, silicon-controlled rectifier (SCR), and other related devices having carbon nanotubes, and methods for making such devices using carbon nanotube technology. Such devices will have nanostructure junctions. The above discussion regarding transistors using carbon nanotube technology may be applied, with appropriate changes, to diode, silicon-controlled rectifier, and other related devices using carbon nanotube technology. And the discussion below regarding diode, silicon-controlled rectifier, and other related devices using carbon nanotube technology may be applied, with appropriate changes, to transistors using carbon nanotube technology. A diode, silicon-controlled rectifier, or other related devices of the invention may be manufactured on the same porous structure as a single-walled carbon nanotube transistor.

Rectifying devices are electronic devices that conduct electricity in a specific direction. Generally, the devices are nonlinear and more easily conduct in a forward direction than the reverse direction. Diodes are two terminal devices with applications of AC-to-DC conversion, separating signals from radio frequencies, on/off switches, logic circuits, voltage regulators, half wave rectification, peak rectification, bridge rectification, limiter circuits, voltage doublers, DC restorers, and more. There are zener diodes which operate in the reverse direction and Schottky diodes which perform well at high frequencies. Desirable qualities of diodes include high breakdown voltages, high current carrying capability, low voltage drop during conductance, very low reverse recovery, and small switching time delays. Thyristors and silicon-controlled rectifiers (SCRs) act as switches where the current generally only passes in one direction.

Generally, an important component in these devices is a junction, which connects two semiconductors or electronic regions within a semiconductor. This junction may be a p-n junction which is a junction for a p-type semiconducting region with an n-type semiconducting region. Another junction includes the combining of regions of differing electron carrier concentration such varying n+ concentration in n-type regions or lower electron concentrations to higher electron concentrations. Another junction includes the combining of regions of differing hole carrier concentration such as p+ concentration in p-type regions or lower hole concentrations to higher hole concentrations. Another junction is a heterojunction between two different materials.

Presently these types of rectifying devices are based largely on silicon technology. Silicon carbide, gallium nitride, gallium arsenide, germanium, and other semiconducting materials are also being used. Limitations to this technology, where the advancement in performance is often referred to as top-down scaling, are in the physical properties of the bulk semiconductor as it scales down to smaller and smaller feature sizes, such as in the nanometer scale, and the development of more advanced lithographic and other processing tools. The possible limitations of current technology in the near future have given momentum to research on nanoscale and molecular materials. This type of technology is often referred to as bottom-up. Two types of one-dimensional nanostructures that have potential application in future technology are nanowires and nanotubes. Nanowires may include silicon, germanium, gallium nitride, metal oxides, III/V elements, II/VI elements, and other materials. Nanowires are solid structures. Nanotubes have hollow cores and include carbon, boron nitride, or other materials, or combinations of these. Carbon is the most common form of nanotube.

Carbon nanotubes are believed to be the most thermally conductive material known, significantly more conductive than diamond and graphite. They are also the strongest material known, with extremely high tensile strength, Young's modulus, and resiliency. Their electrical properties vary from metallic conduction to semiconducting with a variety of band gap sizes, and these properties are determined by their physical structure.

Semiconducting carbon nanotubes may be made p-type by exposure to air, oxygen, or ambient. It is possible to control the majority carrier type and concentration by intentional exposure to gaseous species, polymers, liquids, metallic or semiconducting particles, or various coatings. An approach anneals at 425 degrees Celsius in nitrogen to produce n-type nanotube transistors. Annealing, vacuum heating, or other methods can produce n-type nanotubes by removing adsorbed species such as oxygen.

An approach uses potassium doping to create n-type nanotube segments. Potassium atoms are expelled from a potassium source through electrical heating in vacuum, and the potassium atoms adsorb onto exposed carbon nanotube sections and donate electrons to the tube. Electron donation transfers the segment from p-type to n-type. By protecting part of the carbon nanotube from the potassium doping, one may produce p-n junctions. Electrostatic doping or gating can be used to modify the electrical nature of carbon nanotubes. For instance, gating can be used to change the majority carrier type and concentration, which modulates the nanotube electrical properties.

An approach uses a split gate structure to form p-n junctions in carbon nanotube devices. One gate is set to a positive 10 volts and the other gate is set to a negative 10 volts. This produces a p-side and n-side and a p-n junction, which is shown in the rectification of the current-voltage measurements. Intentional nitrogen doping during carbon nanotube synthesis may be used to create CNx/C junctions. Rectification occurs due to junctions between multiwalled carbon nanotubes and CNx nanotubes. The nitrogen content in the CNx nanotube may be about 9.5 percent.

Nanowires may be fabricated with junctions through doping and heterostructure synthesis. There are gallium nitride nanowires with p-n junctions, where magnesium nitride is added during nanowire synthesis in order to form junctions. Heterostructures and superlattices may occur in nanowires, where alternating segments are produced by alternating the nanowire material precursor during synthesis. Indium phosphide and silicon nanowires with alternating p-n junctions are characterized and show rectification.

Gallium arsenide/gallium phosphide alternating segments may have multiple heterojunctions within single nanowires. Junctions can also be created by traditional means such as ion implantation. Carbon nanotubes may also form junctions with nanowires. There may be a heterojunctions between carbon nanotubes and silicon nanowires. The synthesis is a two-step process where either the silicon nanowires are synthesized then the carbon nanotubes, or the carbon nanotubes were synthesized followed by the silicon nanowires. Devices having these junctions show rectification.

The potential for these nanostructures and their ability to perform as nanoelectronic devices has been shown. It would be advantageous to have methods to incorporate the nanostructures into devices that are practical, scalable, and allow for the voltages, currents, and powers required for current industry applications. Single or few nanostructure devices will not be sufficient in most cases due to the limitations of current and power. New methods and architectures are required to incorporate the nanostructures into practical devices.

What is needed is a scalable and practical method for fabricating nanostructure-based diodes, rectifiers, thyristors, silicon controlled rectifiers, or related devices that takes advantage of the high performance potential of the nanostructures. Combining the potential of nanowires and carbon nanotubes in a controlled manner is advantageous.

One embodiment of the present invention includes a device having a number of carbon nanotubes and nanowires within a porous template or structure including a material such as aluminum oxide ($Al_2O_3$), titanium oxide, niobium oxide, tantalum oxide, zirconium oxide, or other materials, or combinations of these.

The pores are formed by any competent method. One approach uses anodization of metal precursors such as the anodization of aluminum to form porous aluminum oxide. The pores will be vertically aligned. The carbon nanotubes are either directly synthesized within the pores or are transferred to the pores after synthesis. The nanowires are deposited on one end of the pores. A first electrode is placed so that a multitude of the carbon nanotubes are connected.

A second electrode is placed so that a multitude of the nanowires are connected. For example, the first electrode is placed on one side of the template or structure, and the second electrode is placed on the other, for example, opposing or opposite side. The carbon nanotubes may have diameters that do not significantly change along the length of the nanotube and which are less than the diameter of the pores.

The nanowires have diameters about equal to the pore diameters, and partially extend from one end into the pores. The nanowires should cover at least some portion of at least some of the carbon nanotubes. The nanowires may be deposited by electrodeposition, evaporation, sputtering, or related techniques. They may be deposited at the bottom of the pores. They may be deposited from the top of the pores, for example, by pressure injection, force on molten material, evaporation, sputtering, or related techniques. In some embodiments, both ends of the pores are open and the nanowires may be deposited on either end.

One or more additional electrodes (e.g., gates) may be added to modulate the properties of at least some portion of the carbon nanotubes or nanowires, or both. The heterostructure may be used to form a rectifying junction, where current flows better in one direction than another direction. The device is suited for use as electronic device. It is especially suited for use as a diode, rectifier, silicon controlled rectifier, thyristor, varistor, or related devices.

The device is capable of high current densities, high power, and efficient power delivery. There are large densities of possible connections, and it is not necessary for every pore to contain a functioning carbon nanotube-nanowire heterostructure device. The redundancy allows for defects, failures, and low yields. Any unwanted, noneffective, or extraneous carbon nanotubes or portions of these may be removed by any competent method such as chemical, electrical, or mechanical methods, or the like, or any other methods. The device may be configured to obtain significantly higher current densities and power capabilities than is currently conventionally available with semiconductor technology to obtain increased performance, suitable for a variety of power applications.

In one embodiment of the present invention, carbon nanotubes are directly synthesized within the pores of the structure. The structure with pores may be formed by anodization of a metal such as aluminum, titanium, niobium, tantalum, zirconium, or combinations of these. The pores may be formed by etching techniques including, for example, dry etching, plasma etching, chemical etching, wet etching, reactive ion etching, or combinations of these.

The synthesis of carbon nanotubes may occur with or without the presence of catalyst. Chemical vapor deposition may be used for the synthesis of the carbon nanotubes. Any unwanted, noneffective, or extraneous carbon nanotubes or portions of these may be removed by any competent method such as chemical, electrical, or mechanical methods, or the like, or any other methods.

The nanowires may be deposited on either end of the pores. A first electrode is placed on one side of the structure and connects to multiple of the carbon nanotubes. A second electrode is placed on the other, opposing or opposite, side of the structure and connects to multiple of the nanowires. The nanowires cover at least some portion of at least some of the carbon nanotubes and form heterostructures. The electrodes can be placed by any competent method including deposition techniques such as lithographic or nonlithographic techniques. The remaining area within the pores may be partially or completely filled with a material. This material may be used to passivate, protect, stabilize, or modify the properties of the carbon nanotubes or nanowires, or both.

In one embodiment of the present invention, the structure with a number of pores is on a substrate. The substrate may be a semiconductor, conductor, or insulator. The substrate may be used primarily for mechanical support, or it may be used for electrical or thermal advantages. In one embodiment, the substrate is one of the electrodes. The substrate is coated with a metal such as, for example, aluminum, titanium, niobium, tantalum, zirconium, or combinations of these by any effective method. For instance, the metal may be deposited by sputtering, thermal evaporation, or electron beam evaporation.

The metal is anodized which creates a number of pores, where multiple of the pores extend to the underlying substrate. Before the deposition of the metal to be anodized, the underlying substrate may be coated with a conducting layer to define or improve the conductivity of the bottom electrode. This layer may be a metal such as molybdenum, tungsten, platinum, or other conductive layer.

An additional catalyst deposition step may be used after the conducting layer on underlying substrate is deposited. The catalyst layer may also be applied directly to the underlying substrate in the absence of the conducting layer. The catalyst is exposed after the formation of the pores in the insulating layer, and may be used for the synthesis of carbon nanotubes. In another embodiment, the catalyst is deposited after the formation of the pores. In yet another embodiment, the synthesis of carbon nanotubes does not require the catalyst. Any unwanted, noneffective, or extraneous carbon nanotubes or portions of these may be removed by any competent method including chemical, electrical, or mechanical methods, or the like, or any other methods.

Nanowires are deposited and form heterostructures with at least some of the carbon nanotubes. In one embodiment, the nanowires are deposited at the bottom of the pores and extend upwards partially through the pores. The bottom electrode (i.e., substrate or conductive layer on the substrate) then connects to a multitude of the nanowires. A top electrode is placed that connects to a multitude of the carbon nanotubes. In another embodiment, the nanowires are deposited on the top end of the pores. The bottom electrode (i.e., substrate or conductive layer on the substrate) is used to connect to a multitude of the carbon nanotubes. A top electrode is placed that connects to a multitude of the nanowires.

In one embodiment of the present invention, the structure with a number of pores is on a substrate. The substrate may be a semiconductor, conductor, or insulator. The substrate may be used primarily for mechanical support or it may be used for electrical or thermal advantages.

In one embodiment, the substrate is one of the electrodes. The substrate is coated with a material such as a conductive material, and a number of pores are formed in the material, where multiple of the pores extend to the underlying substrate. The conductive material may be deposited by any competent method. For instance, the metal may be deposited by sputtering, thermal evaporation, or electron beam evaporation.

The pores may be formed by any competent method. For instance, etching techniques may be used including, for example, dry etching, plasma etching, chemical etching, wet etching, reactive ion etching, or combinations of these. A mask may be used for the etching process. The process may including using a photoresist, a metal, a metal oxide, an insulator, a semiconductor, an anodized aluminum oxide layer with pores, an anodized metal oxide layer with pores, or combinations of these. Before the deposition of the material, the underlying substrate may be coated with a conducting layer to define or improve the conductivity of the bottom electrode such as, for example, a metal, molybdenum, tungsten, platinum, or other conductive layer.

An additional catalyst deposition step may be used after the conducting layer on underlying substrate is deposited. The catalyst layer may also be applied directly to the underlying substrate in the absence of the conducting layer. The catalyst is exposed after the formation of the pores in the material, and may be used for the synthesis of carbon nanotubes. In another embodiment, the catalyst is deposited after the formation of the pores. In yet another embodiment, the synthesis of carbon nanotubes does not require the catalyst. Any unwanted, noneffective, or extraneous carbon nanotubes or portions of these may be removed by any competent method including, for example, chemical, electrical, or mechanical methods, or the like, or any other method.

Nanowires are deposited and form heterostructures with at least some of the carbon nanotubes. In one embodiment, the nanowires are deposited at the bottom of the pores and extend upwards partially through the pores. The bottom electrode (i.e., substrate or conductive layer on the substrate) then connects to a multitude of the nanowires. A top electrode is placed that connects to a multitude of the carbon nanotubes. In another embodiment, the nanowires are deposited on the top end of the pores. The bottom electrode (i.e., substrate or conductive layer on the substrate) is used to connect to a multitude of the carbon nanotubes. A top electrode is placed that connects to a multitude of the nanowires.

In one embodiment of the present invention, carbon nanotubes are synthesized before incorporation into the structure with a number of pores. The synthesis can be by any competent method, for example, chemical vapor deposition, arc-discharge, or laser ablation, or the like, or any other techniques. The carbon nanotubes can further be separated to optimize the nanotube characteristics for incorporation in the device. These characteristics may be the electrical properties, lengths, diameters, defect concentration, and other properties.

Carbon nanotubes in solutions, suspensions, or composites are transferred to the pores as the liquid flows through or into the pores. Microfluidic methods may be used. The structure with pores may be a membrane where the majority of pores are open on both sides, or it may be supported by remaining bulk material, or it may be on a substrate. Any unwanted, noneffective, or extraneous carbon nanotubes or portions of these may be removed by any competent method such as, for example, chemical, electrical, or mechanical methods, or the like, or any other methods.

The nanowires may be deposited on either end of the pores. A first electrode is placed on one side of the structure and connects to multiple of the carbon nanotubes. A second electrode is placed on the other, for example, opposing or opposite, side of the structure and connects to multiple of the nanowires. The nanowires cover at least some portion of at least some of the carbon nanotubes and form heterostructures. The electrodes can be placed by any competent method including deposition techniques including lithographic or nonlithographic techniques. The remaining area within the pores may be partially or completely filled with a material. This material may be used to passivate, protect, stabilize, or modify the properties of the carbon nanotubes, or combinations of these.

In one embodiment of the present invention, the structure with a number of pores is a conductive material. Before deposition of carbon nanotubes and nanowires, a thin insulating layer is formed on the walls of the pores. The layer may be formed by any competent method including, for example, forming a metal oxide layer on the conductive material by heating in an oxidative environment; by forming a native oxide layer; or by sputtering, evaporating, or depositing an insulating layer on the pore walls. The structure is then useful as a gate electrode, which is used to modulate the properties of at least some portion of the carbon nanotubes or nanowires, or both.

In one embodiment of the present invention, the structure with a number of pores can be primarily made of an insulating, conductive, or semiconductive material, where the pattern of pores is transferred to it by any competent method. The pattern of pores in the structure may be made by transfer from a first porous structure that includes aluminum oxide, titanium oxide, niobium oxide, tantalum oxide, zirconium oxide, or combinations of these, and that has been made porous as discussed elsewhere in this patent. For example, the transfer of pores can use the first porous structure as a mask and etching through the pores into the other medium, where the etching can be through chemical, mechanical, or electrical methods such as, for example, dry etching, plasma etching, chemical etching, wet etching, reactive ion etching. The first porous structure can remain, be partially removed, or be completely removed before forming the device.

In one embodiment of the present invention, the method is used to fabricate an electronic device that is a diode, rectifier, silicon controlled rectifier, or thyristor including a structure that defines a number of pores, carbon nanotubes within at least some of the number of pores, nanowires forming heterostructures with at least some of the carbon nanotubes, a first electrode on a first side of the structure connecting to multiple ones of the carbon nanotubes, and a second electrode on a second (e.g., opposing) side of the structure connecting to multiple ones of the nanowires.

The structure with pores may include a metal, a semiconductor, or an insulator. For instance, the structure may include aluminum oxide, titanium oxide, niobium oxide, tantalum oxide, zirconium oxide, silicon oxide, silicon nitride, yttrium oxide, lanthanum oxide, hafnium oxide, zinc oxide, silicon, gallium nitride, silicon carbide, gallium arsenide, plastic, polymer, glass, quartz, carbon, aluminum, copper, molybdenum, tantalum, tungsten, a noble metal, or combinations of these. At least one gate electrode may be added to the device. In another embodiment, the structure that defines the number of pores may be used as a gate. The gate can electrostatically modulate the properties of the device. In this embodiment, a thin insulating or protective layer may be added to the structure before the deposition or synthesis of carbon nanotubes and nanowires.

In another embodiment of the present invention, the method is used to fabricate a device that is a diode, rectifier, silicon controlled rectifier, or thyristor including a structure with a number of pores, where the structure includes at two or more layers. The layers may be different materials. The layers may be insulating, semiconducting, or conductive. In one embodiment, there are two or more layers, where at least one is insulating and at least another is conductive. The structure may be fabricated by forming a number of pores on a first layer and transferring it to additional layers. For instance, the first layer may include aluminum oxide, titanium oxide, niobium oxide, tantalum oxide, zirconium oxide, or combinations of these, where the pores are formed by any competent method including anodization methods. The pores may be transferred to additional layers by any competent method such as, for example, etching through chemical, mechanical, or electrical methods, or dry etching, plasma etching, chemical etching, wet etching, reactive ion etching, or combinations of these.

In one embodiment of the present invention, a significant number of the carbon nanotubes are semiconducting and the nanowires are metallic. In another embodiment, the carbon nanotubes are primarily metallic and the nanowires are semiconducting. In yet another embodiment, a significant number of carbon nanotubes are semiconducting and the nanowires are semiconducting.

In one embodiment of the present invention, the electrical properties of the carbon nanotubes, nanowires, or both, are modified by chemical or electrical methods, for example based on controlled environmental exposure, ambient exposure, exposure to oxidative environments, intentional doping or coatings, annealing, heating in vacuum, electrostatic doping, polymer coatings, or combinations of these.

The method according to the present invention allows for large densities of possible connections, and it is not necessary for every pore to contain a functioning carbon nanotube-nanowire heterostructure device. The redundancy allows for defects, failures, and low yields.

In one embodiment of the present invention, after device fabrication, the electronic device is properly mounted and packaged in order to achieve overall mechanical, electrical, and thermal quality and stability as a final product.

Referring again to FIGS. 8 and 9, the pores are open at one end. Pore diameter is usually from about 5 nanometers to about 500 nanometers. Pore density is usually about $10^7$ per square centimeter to about $10^{12}$ per square centimeter. In some specific embodiments, the pore density will be in a range from about $10^8$ to about $10^{11}$. FIG. 8 top view shows pores arranged in a hexagonal pattern. As discussed previously, any other competent pattern may also or instead be used.

The structure is made by any competent method such as, for example, electrochemical anodized etching of a material including aluminum, titanium, niobium, tantalum, zirconium, or combinations of these. The length and density of the pores is determined by anodization conditions including voltage, current, and time. Pores can be widened after fabrication by addition chemical techniques such as conventional techniques.

The more pure (e.g., 99.99 percent or better) the precursor material is the better the results. It is cleaned and annealed prior before fabrication. Usually the material is electropolished for some time. A first layer of pores may be created which need not be too organized and consistent, which is removed by chemical means, and the second stage of pore fabrication is then used to make the nicely arranged and quality pores. The structure may also be made by lithographic methods and etching techniques. For example, a mask with pores may be used with dry etching techniques to produce the structure with a number of pores. The mask may be a photoresist, a metal, a metal oxide, silicon oxide, silicon nitride, or combinations of these. The mask may be removed after the etching process.

The process illustrated by FIG. 9 provides a structure where at least some of the number of pores extends through the structure. Both ends of the pores are open. The thickness of the structure (i.e., the length of the pores) is usually greater than 10 microns.

Figure 14:
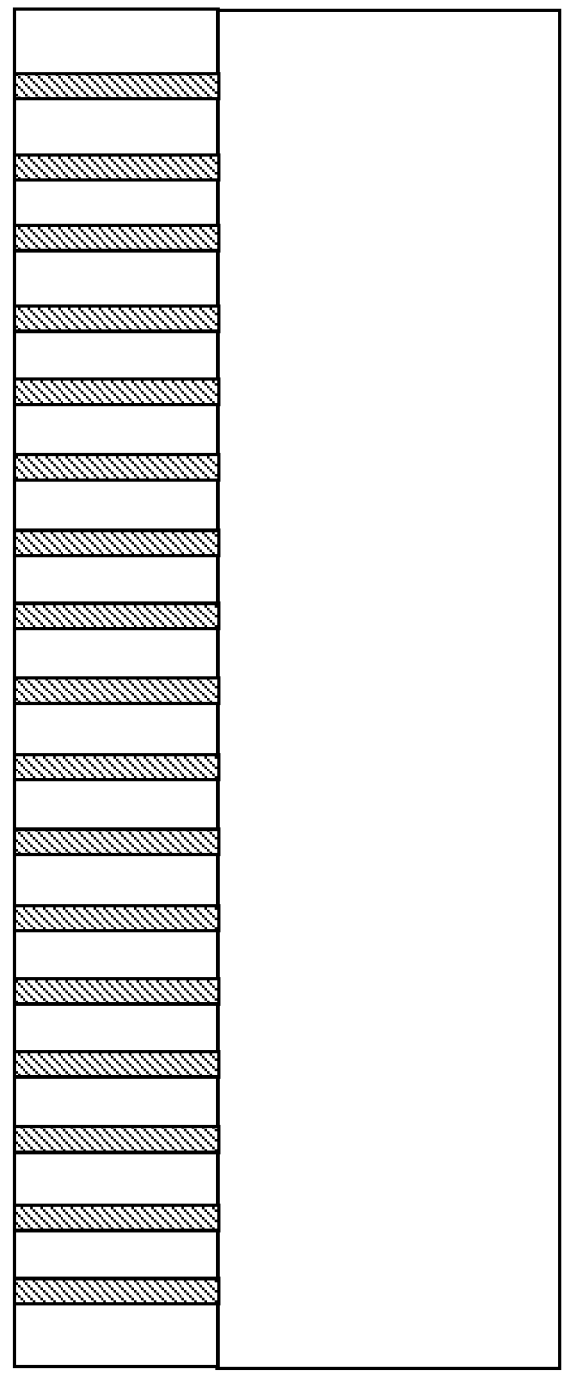
FIG. 14 shows a cross-sectional view a porous structure supported a structure or substrate without pores.

FIG. 14 illustrates the structure with the number of pores on a substrate. A significant number of the pores can extend all the way to the substrate. The substrate can be a conductor, semiconductor, or insulator. The substrate can be the bulk material of the structure. The substrate can be used for supporting the structure with the number of pores, which is particularly useful when the structure is less than about 10 microns thick.

Figure 15:
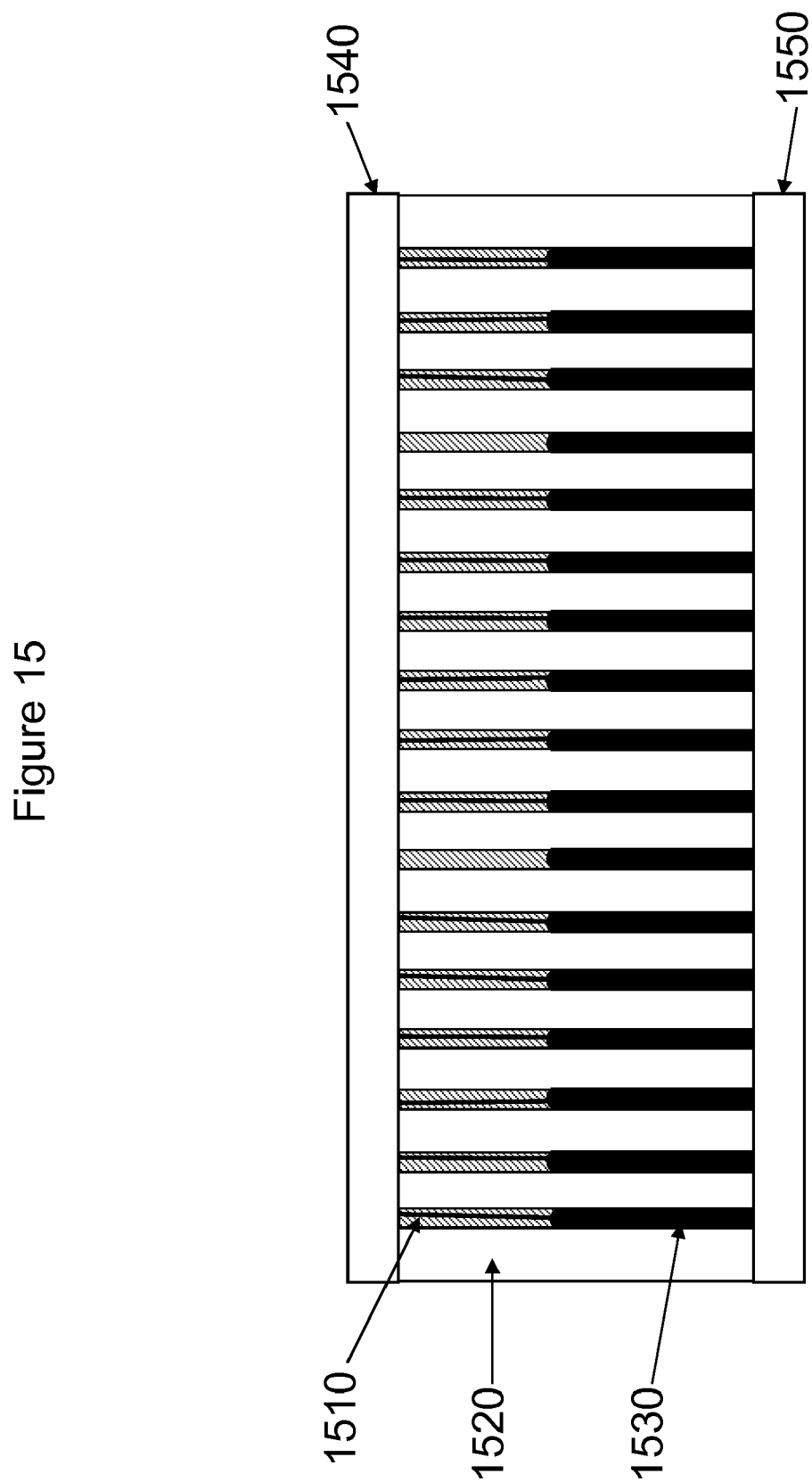
FIG. 15 shows a cross-sectional view of a device with carbon nanotubes in the pores of a porous structure and nanowires covering a portion of the carbon nanotubes.
Figure 16:
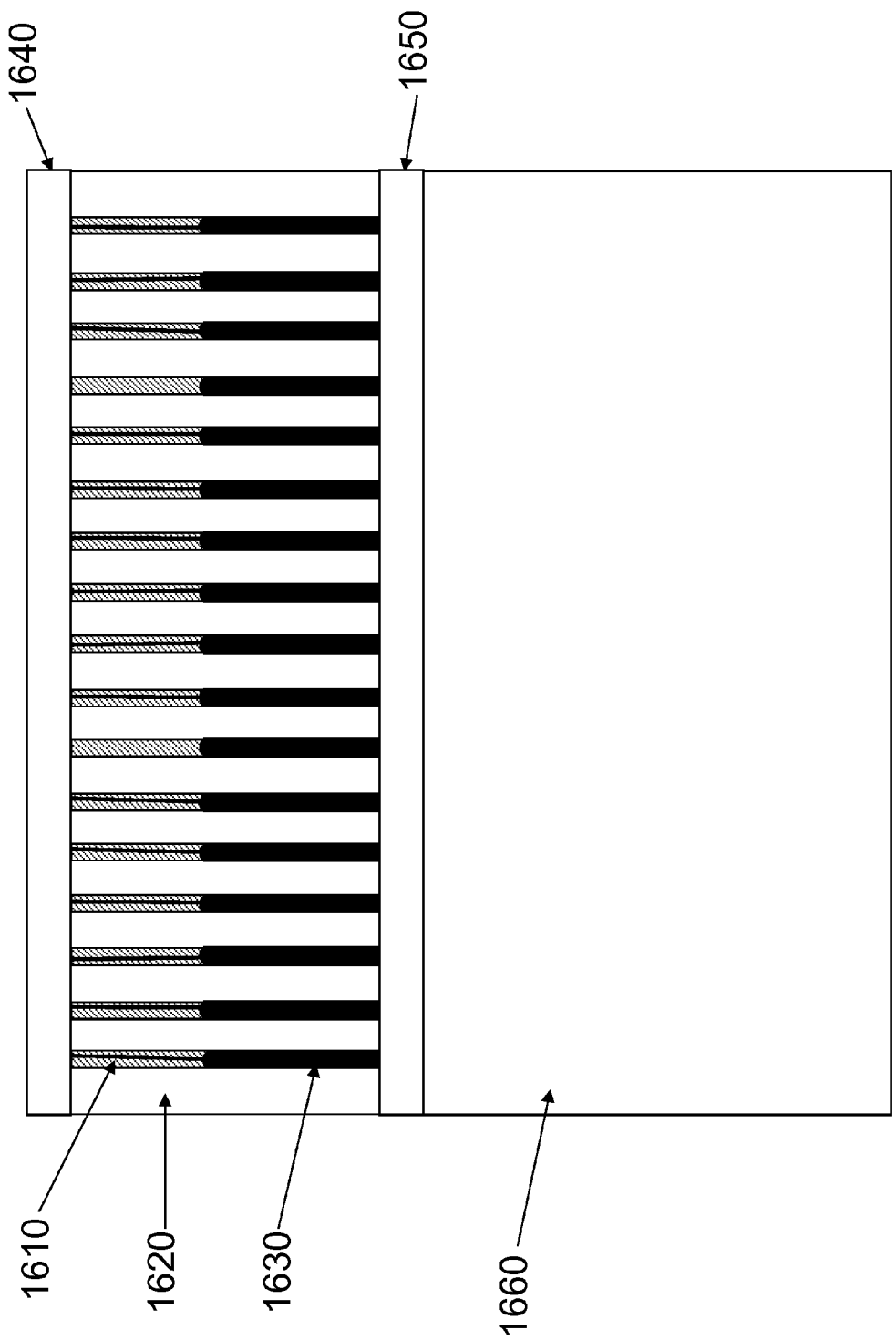
FIG. 16 shows a device where a substrate is used and connected to a bottom electrode.

FIG. 15 show a cross-sectional view of a device with carbon nanotubes 1510 in the pores of the structure 1520 and nanowires 1530 covering a portion of the carbon nanotubes. Top 1540 and bottom 1550 electrodes are defined. FIG. 16 illustrates the device where a substrate 1660 is used and connected to the bottom electrode.

Referring to FIG. 15, carbon nanotubes can be synthesized within the pores or transferred to the pores. A desired case is one carbon nanotube per pore. However multiple nanotubes per pore may be utilized. Due to redundancy and a large number of pores per unit area, not all pores must yield an effective device component. Some amounts of missing or defective pores, missing or noneffective carbon nanotubes or nanowires, or both, carbon nanotube or nanowires, or both, removed by device architecture requirements, and other yield issues will not make the device inoperative. Undesirables can be removed by any competent technique such as, for example, chemical, mechanical, or electrical techniques, or the like, or any other technique. In view of redundancy and device density, the fact that not all pores yield an effective device component will not render the device defective or inoperative.

Direct synthesis of carbon nanotubes within the pores can use any competent method. In one embodiment of the present invention, catalyzed chemical vapor deposition is used with an appropriate catalyst for carbon nanotubes in the pores. The appropriate catalyst may be, for example, iron, nickel, cobalt, molybdenum, or combination of these, or combination with other metals, where the catalyst may be placed through metal deposition such as by metal evaporators or electrochemical deposition of metals or by a wet deposition of catalyst where the metal catalyst nanoparticle or particles is supported by a larger inorganic support or an organic shell (such as a ferritin protein or dendrimer). In another embodiment, chemical vapor deposition is used without the presence of a catalyst.

The transfer method of carbon nanotube placement can use any competent method. In one embodiment of the present invention, a method is as follows. Fabricate pores in the structure including metal, semiconductor, insulator, aluminum oxide, titanium oxide, niobium oxide, tantalum oxide, zirconium oxide, or combinations of these, and then expose each side of the pores. Flow a solution or suspension containing carbon nanotubes through the pores such that it leaves carbon nanotubes in the pores with the ability to contact at least one side with metal electrodes. The carbon nanotubes are synthesized beforehand in bulk by any competent method, for example, a CVD, arc-discharge, or laser ablation method or the like or any other method. Then they are put in solution or suspension by any competent method. The carbon nanotubes can further be separated by size and length and electrical characteristic. It is therefore possible to get a higher concentration of optimized carbon nanotubes than is possible by synthesis alone. The solution or suspension can also be optimized for carbon nanotube diameter and length.

Following deposition of the carbon nanotubes, the nanowires are deposited in the pores and cover at least a portion of the carbon nanotubes. The nanowires may be deposited by any competent method such as, for example, electrochemical, evaporation, sputtering, or related techniques, or combinations of these. Molten or liquid materials may be injected into the pores by, for example, pressure injection, capillary forces, or related techniques. The first electrode connects to multiple ones of the carbon nanotubes. The second electrode connects to multiple ones of the nanowires.

Dimensions given above for pores, carbon nanotubes, and porous structure may be applied here. A diameter of a nanowire may be up to a size of a pore. The diameter of the nanowire may be less than the diameter of the pore. For example, if the pore is 100 nanometers in diameter, then the nanowire may be up to 100 nanometers is diameter.

Referring to FIG. 16, the structure with pores is supported by a substrate and a significant number of the pores extend all the way to the substrate. Carbon nanotubes can be synthesized within the pores or transferred to the pores. The substrate may be coated with a conductive layer. The substrate or conductive layer on the substrate may be coated with effective catalyst for carbon nanotube synthesis. Direct synthesis of carbon nanotubes within the pores can use any competent method. In one embodiment of the present invention, catalyzed chemical vapor deposition is used. The catalyst may be predeposited at the bottom of the pores or deposited in the pores after pore formation. In another embodiment, chemical vapor deposition is used without the presence of a catalyst.

Following deposition of the carbon nanotubes, the nanowires are deposited in the pores and cover at least a portion of the carbon nanotubes. The nanowires may be deposited by any competent method such as, for example, electrochemical, evaporation, sputtering, or related techniques, or combinations of these. Molten or liquid materials may be injected into the pores by, for example, pressure injection, capillary forces, or related techniques. The nanowires may be deposited on the bottom of the pores (e.g., by electrodeposition, evaporation, or sputtering techniques) and connect to the bottom electrode. The opposing electrode would then connect to multiple ones of the carbon nanotubes. The nanowires may instead be deposited on the top side of the pores (e.g., by pressure injection, evaporation, molten material injection, evaporation, or sputtering techniques) and connect to the top electrode. The bottom electrode would then connect to multiple ones of the carbon nanotubes.

Figure 17:
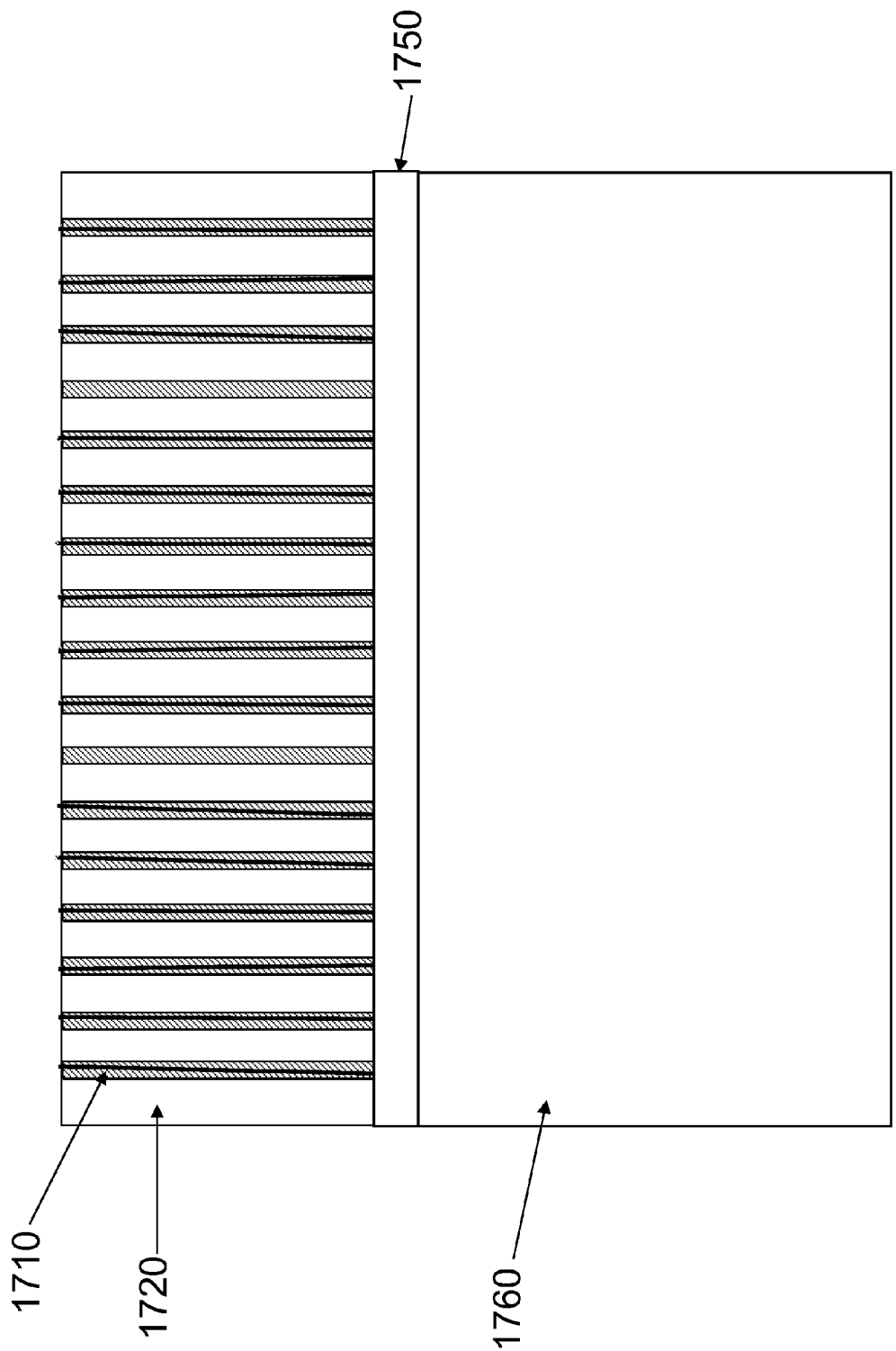
FIG. 17 shows carbon nanotubes deposited in a structure with pores, where an optional conducting layer is between the structure with pores and a support substrate.
Figure 18:
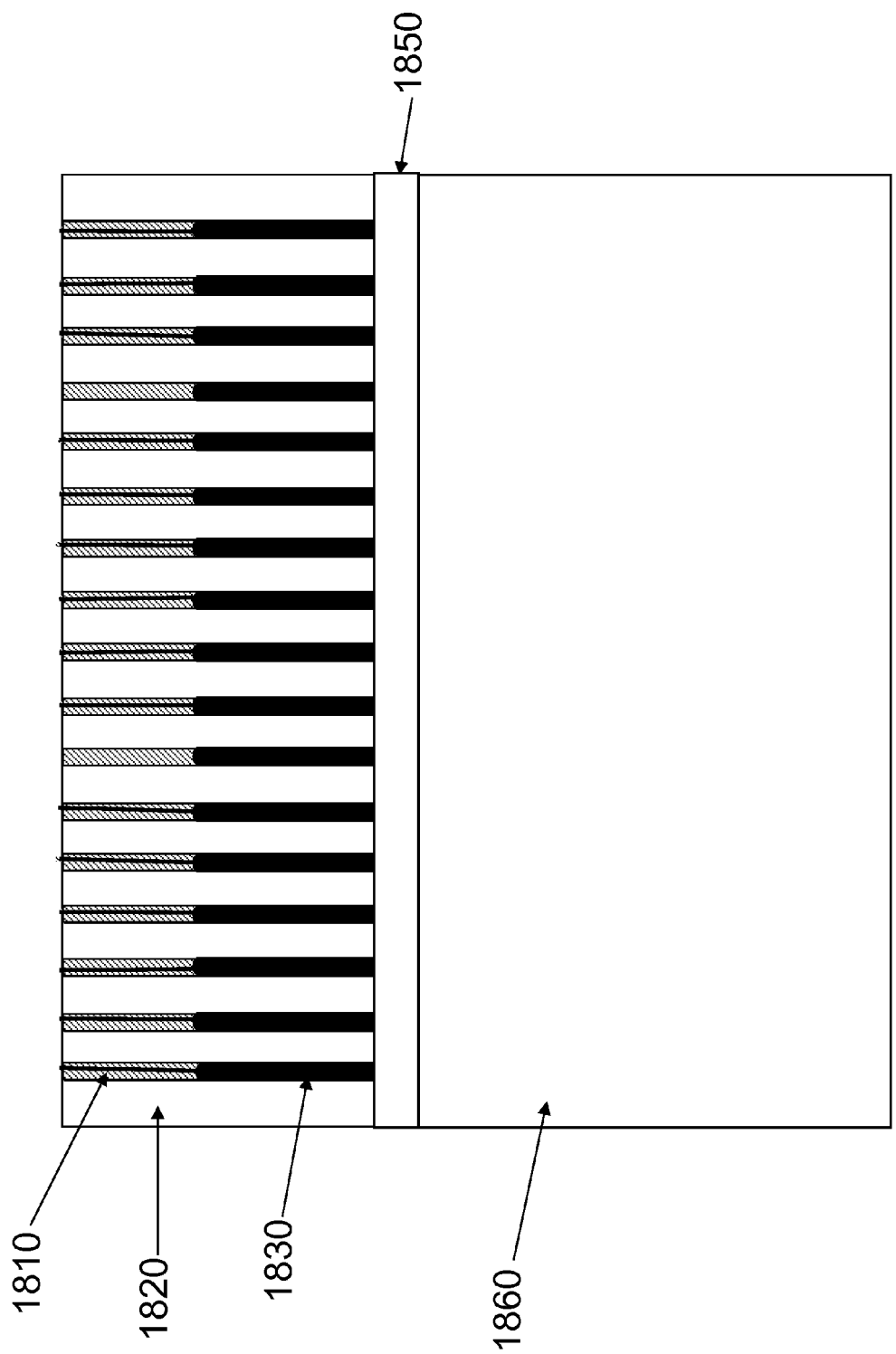
FIG. 18 shows nanowires deposited in pores and covering a portion of the carbon nanotubes.
Figure 19:
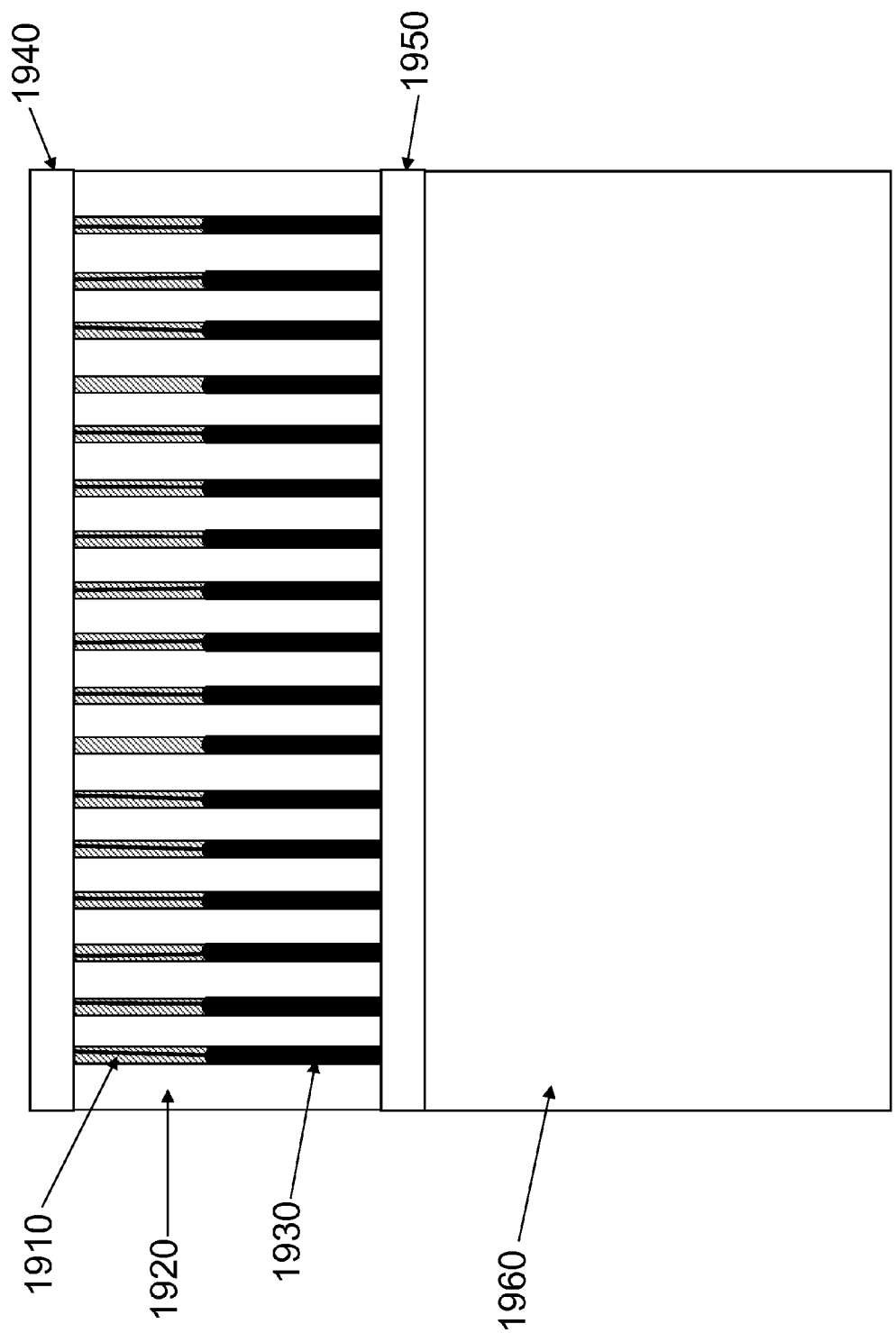
FIG. 19 shows a first electrode connecting to multiple ones of the carbon nanotubes, and a second electrode connected to multiple ones of the nanowires.
Figure 20:
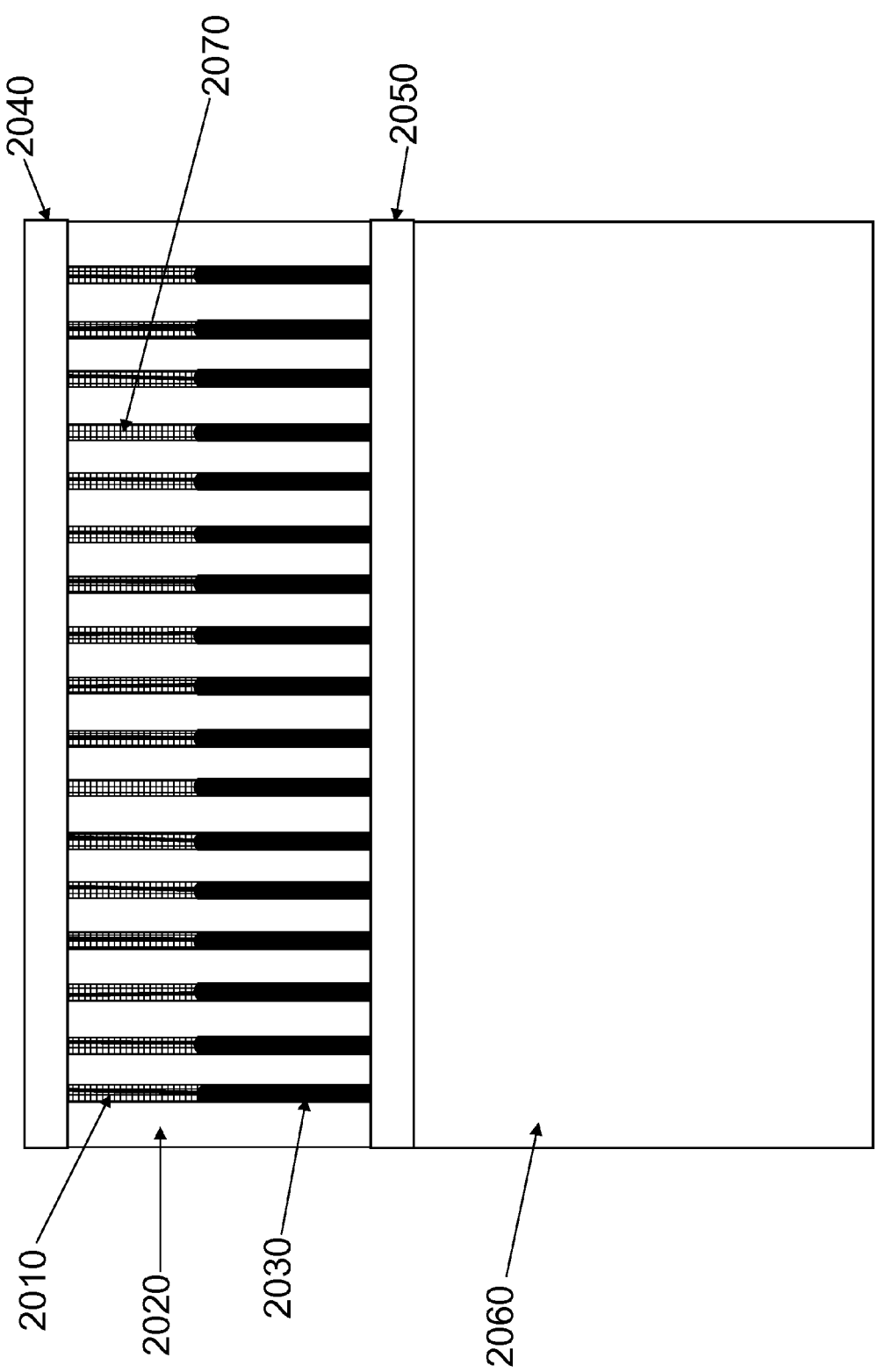
FIG. 20 shows an optional filler material may be used to fill-in a portion of the pores.

FIGS. 17, 18, 19, and 20 show results of a process for device fabrication. FIG. 17 shows carbon nanotubes 1710 deposited in a structure 1720 with a number of pores. There is an optional conducting layer 1750 between the structure with pores and support substrate 1760. FIG. 18 shows the nanowires 1830 deposited in the pores and covering a portion of the carbon nanotubes. FIG. 19 shows the first electrode 1940 connecting to multiple ones of the carbon nanotubes. The second electrode 1950 is connected to multiple ones of the nanowires. FIG. 20 shows an optional filler 2070 material that is used to fill-in a portion of the pores.

A structure is provided that defines a number of pores. In one embodiment, the pores extend to a substrate. There may be a conductive layer between the pores and the substrate. In some embodiments that use a direct synthesis method of carbon nanotubes, there may be catalytic species on the optional conductive layer. Carbon nanotubes are deposited in the pores such as, for example, by direct synthesis such as by CVD or by transferring presynthesized carbon nanotubes to the pores.

Nanowires are deposited at the bottom of the pores and cover at least a portion of the carbon nanotubes, and form a carbon nanotube-nanowire heterostructure. One electrode that connects to a multitude of the nanowires is the bottom electrode, for example, the conductive layer. The top electrode is deposited and connects to a multitude of the carbon nanotubes. The carbon nanotube-nanowire heterostructures are then electrically connected and can function as a current carrying device. An optional filler may be added to the device in the open area of the pore. This area may be above the nanowire which is not filled by the carbon nanotubes. The filler may be used to passivate, protect, or stabilize the carbon nanotubes, nanowires, pores, or combinations of these. The filler may also be useful in doping or electrically modifying all or part of the carbon nanotubes.

Figure 21:
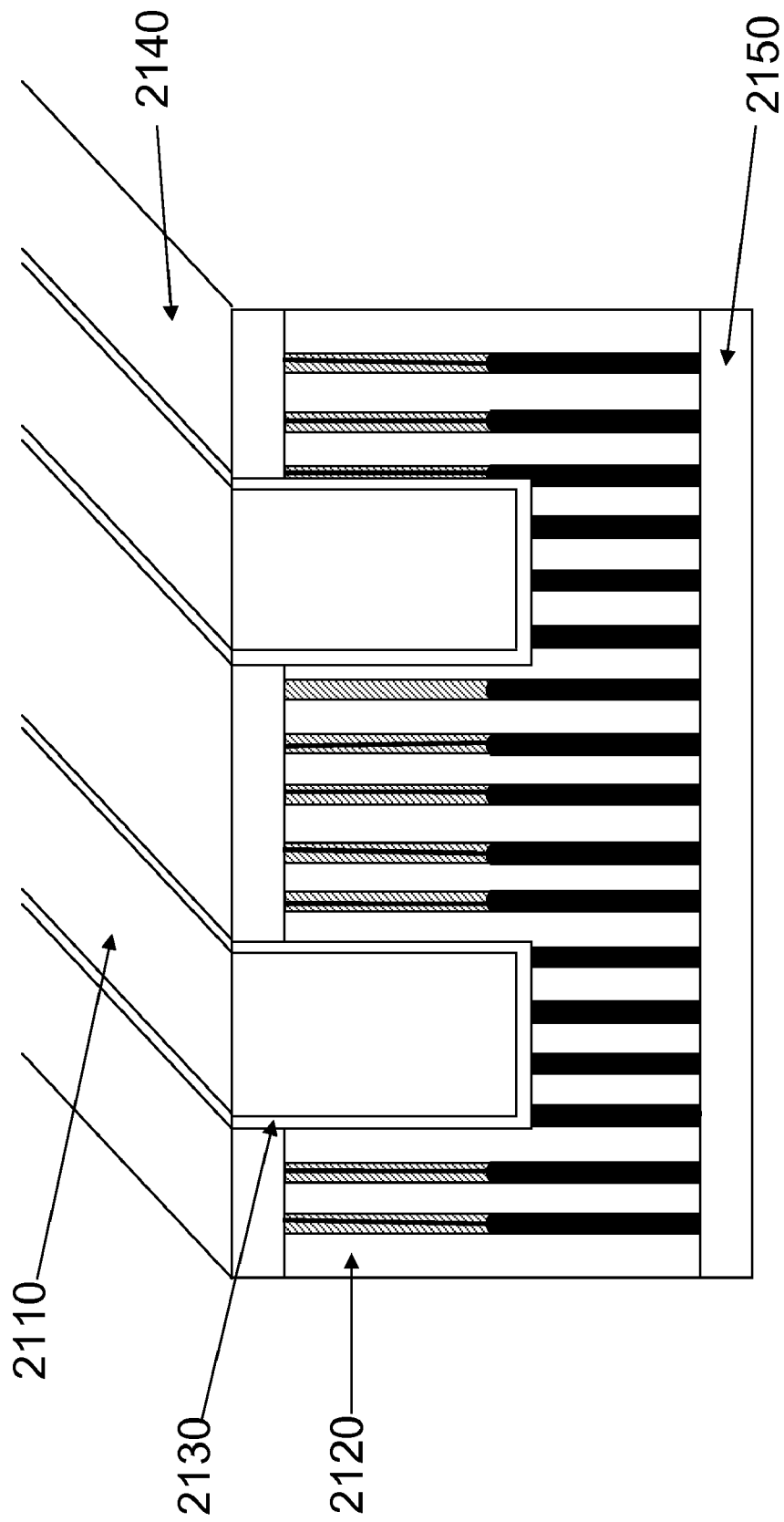
FIG. 21 shows a perspective view of a diode device of the invention.

FIG. 21 schematically illustrates, in a perspective view, a gate material 2110 added where the gate is partially etched into the structure 2120. A thin layer 2130 insulates the conductive gate from electrical contact with either the first electrode 2140 or second electrode 2150. An optional substrate is not shown.

A gate electrode is fabricated either on one or both sides of the porous structure. A voltage on the gate electrode is used to modulate the electrical properties of the carbon nanotubes, nanowires, or both. The gate electrode is placed near enough to the nanostructure components in order to be effective. The gate electrode can also be etched into the structure that defines a number of pores so as to potentially be more effective. The figure shows the gate as partially etched into the structure. The thin layer between the gate material and structure electrically isolates the conductive gate material from the first electrode, second electrode, carbon nanotubes, and nanowires. The structure can be supported by an optional substrate (not shown).

Figure 22:
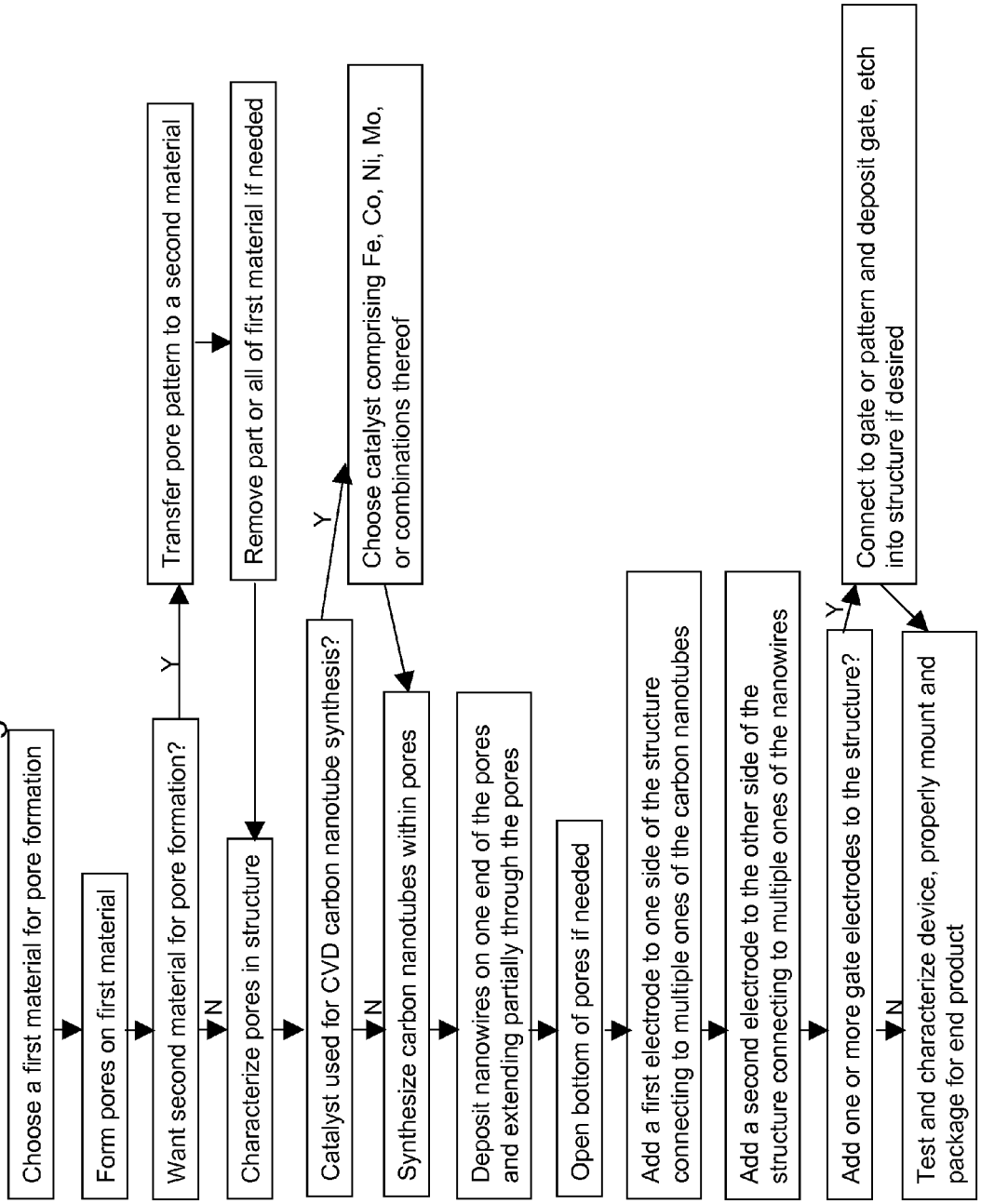
FIG. 22 shows a flow diagram of a technique for fabricating a single-walled carbon nanotube diode device using chemical vapor deposition (CVD) synthesis.

FIG. 22 shows a flow diagram of a direct synthesis method for carbon nanotube placement, according to specific embodiments of the present invention. According to the flow diagram: (1) A first material is selected for pore formation. (2) Pores are formed on the first material. (3) Is a second material desired for pore formation? (4) If so, transfer pore pattern to a second material. (5) If not, characterize the pores in the structure. (6) Will a catalyst be used for CVD carbon nanotube synthesis? (7) If yes, then choose a catalyst including Fe, Co, Ni, Mo, or a combination of these. (8) If not, deposit nanowires on one end of the pores, extending partially through the pores. (9) Open the bottom of the pores if needed. (10) Add a first electrode to one side of the structure. This electrode will connect to multiple ones of the carbon nanotubes. (11) Add a second electrode to the other side of the structure. This electrode will also connect to multiple ones of the carbon nanotubes. (12) Add one or more gate electrodes to the structure? (13) If so, connect to gate or pattern and deposit gate, etch into structure if desired. (14) If not, test and characterize the device, properly mounting the package for the end product.

Figure 23:
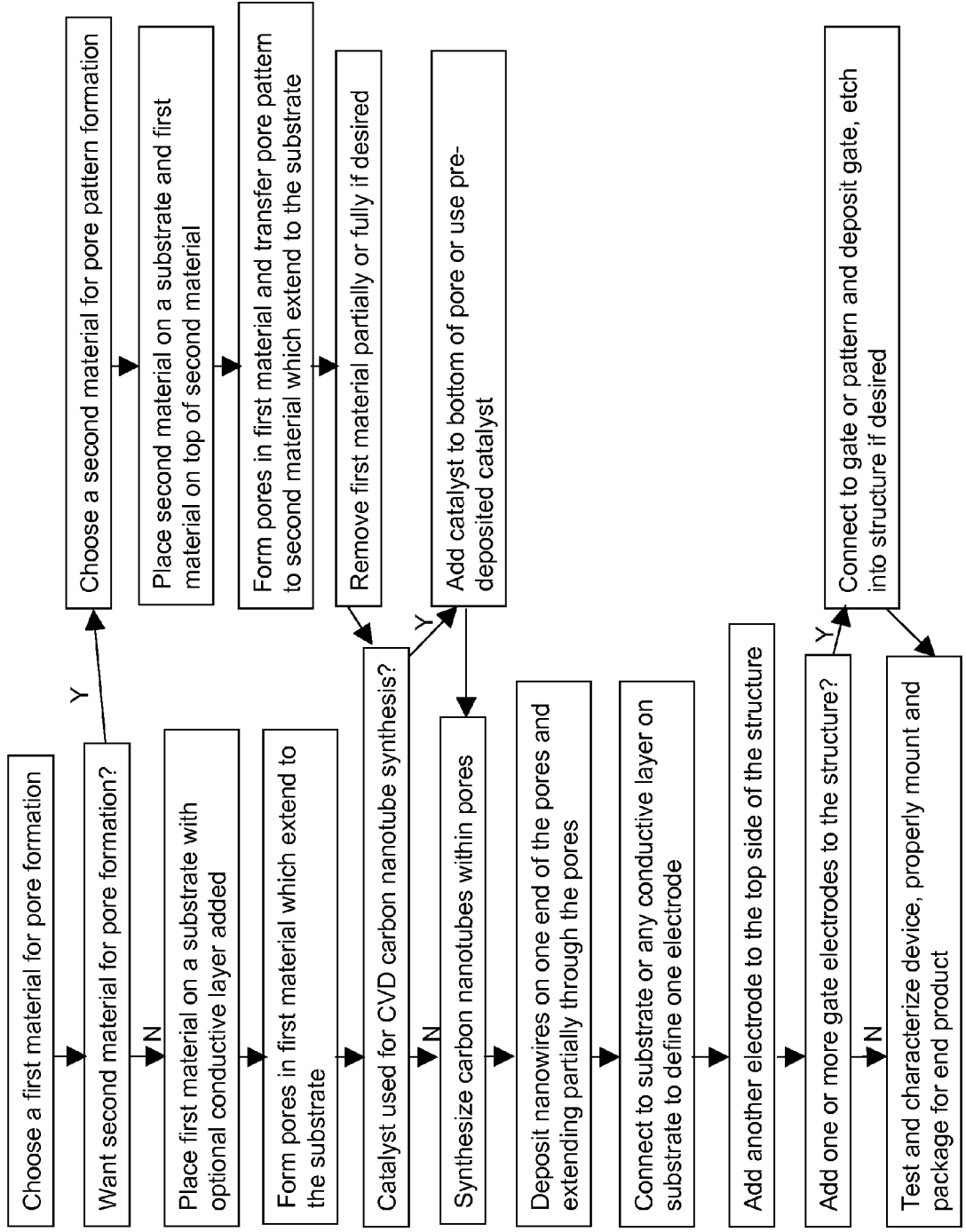
FIG. 23 shows a flow diagram of a technique for fabricating a single-walled carbon nanotube diode device using chemical vapor deposition (CVD) synthesis, where a substrate is added to the porous structure.

FIG. 23 is a schematic flow diagram of a direct synthesis method for carbon nanotube placement, according to specific embodiments of the present invention where a substrate is in addition to the porous structure with a number of pores. According to the flow diagram: (1) A first material is selected for pore formation. (2) Is a second material desired for pore formation? If not, proceed to step 7. (3) If so, choose a second material for pore pattern formation. (4) Place second material on a substrate and first material on top of second material. (5) Form pores in first material and transfer pore pattern to second material which extend to the substrate. (6) Remove first material partially or fully if desired. Then go to step 9. (7) Place first material on a substrate with optional conductive layer added. (8) Form pores in first material which extends to the substrate. (9) Will a catalyst be used for CVD carbon nanotube synthesis? (10) If yes, add catalyst to bottom of pore or use predeposited catalyst. (11) If not, synthesize carbon nanotubes within pores. (12) Deposit nanowires on one end of the pores and extending partially through the pores. (13)

Connect to substrate or any conductive layer on substrate to define one electrode. (14) Add another electrode to the top side of the structure. (15) Add one or more gate electrodes to the structure? (16) If yes, connect to gate or pattern and deposit gate, and etch into structure if desired. Proceed to 17. (17) If not, test and characterize device, and properly mount and package for end product.

FIG. 24 is a schematic flow diagram of a transfer method for carbon nanotube placement, according to specific embodiments of the present invention. According to the flow diagram: (1) A first material is selected for pore formation. (2) Pores are formed on the first material. (3) Is a second material desired for pore formation? If not, proceed to step 5. (4) If so, transfer pore pattern to a second material. Then, remove part or all of first material if needed. Proceed to step 5. (5) Characterize pores in structure. (6) Open both ends of pores if needed. (7) Transfer carbon nanotubes to the pores by flowing a solution, suspension, polymer or other composite in or through the pores. (8) Verify that carbon nanotubes are deposited within the pores. (9) Deposit nanowires on one end of the pores and extending partially through the pores. (10) Add a first electrode to one side of the structure connecting to multiple ones of the carbon nanotubes. (11) Add a second electrode to the other side of the structure connecting to multiple ones of the nanowires. (12) Add one or more gate electrodes to the structure? (13) If yes, connect to gate or pattern and deposit gate, etch into structure if desired. Proceed to 14. (14) If not, test and characterize device, and properly mount and package for end product.

Other embodiments of the present invention are apparatuses or articles produced according to any method embodiment of the present invention or produced using any apparatus or article embodiment of the present invention.

In an embodiment, the invention includes a method of making an electrical device, including (1) providing a structure that defines a number of pores; (2) depositing carbon nanotubes within at least some of the number of pores, where the diameter of the carbon nanotubes is less than the diameter of the pores; (3) depositing nanowires on one side of at least some of the number of pores, where the nanowires extend partially through the pores and cover at least some portion of at least some of the carbon nanotubes; (4) providing a first electrode on a first side of the structure connecting to multiple ones of the carbon nanotubes; and (5) providing a second electrode on a second (e.g., opposing) side of the structure connecting to multiple ones of the nanowires.

The structure may include aluminum oxide, titanium oxide, niobium oxide, tantalum oxide, zirconium oxide, or combinations of these. The structure may include silicon oxide, silicon nitride, yttrium oxide, lanthanum oxide, hafnium oxide, or combinations of these. The structure may include a metal, a semiconductor, an insulator, or combinations of these.

The number of pores may include pores which are continuous and substantially parallel to each other. The number of pores may include pores with diameters within the range of about 1 nanometer to about 200 nanometers. The number of pores may include pores with lengths in the range from about 10 nanometers to about 10 microns. The number of pores may include pores with lengths of greater than about 10 microns.

The structure may have pore densities of from about $10^6$ per square centimeter to about $10^{14}$ per square centimeter.

Anodization of a metal may be used to form the structure that includes the number of pores. This metal may include aluminum, titanium, niobium, tantalum, zirconium, or combinations of these.

The structure with pores may be formed by dry etching. A mask may be used that includes a photoresist, a metal, a metal oxide, silicon oxide, silicon nitride, or combinations of these.

At least a given percentage of pores may be known to contain carbon nanotubes. Each pore may contain zero, one, or multiple carbon nanotubes. The nanowires may be metallic or semiconducting.

The nanowires may include silicon, germanium, gallium nitride, gallium arsenide, cadmium selenide, tin oxide, zinc oxide, a III/V semiconductor, a II/VI semiconductor, a metal oxide, a metal, or combinations of these. The nanowires may have diameters that are approximately equal to the diameter of the pores. The nanowires may have diameters that are less than the diameter of the pores.

There may be at least one gate electrode added. The at least one gate may be used to modulate the electrical properties of the carbon nanotubes, nanowires, or both.

The carbon nanotubes may be synthesized within the at least some of the number of pores. Chemical vapor deposition is one technique to synthesize the carbon nanotubes. An effective catalyst may be used to synthesize the carbon nanotubes. This catalyst may include Fe, Co, Ni, Mo, or combinations of these. The catalyst may be an alloy of Fe, Co, Ni, or Mo.

The carbon nanotubes may be transferred to the at least some of the number of pores. The carbon nanotubes, before being transferred to the pores, may have been synthesized by chemical vapor deposition, arc-discharge, or laser ablation techniques. The carbon nanotubes may have been in solutions or suspensions for use in transfer to the structure. The solution or suspension flowed into or through the pores in the structure and carbon nanotubes may be deposited within the pores.

Unwanted carbon nanotubes, or portions of these, are destroyed, modified, or removed by chemical, mechanical, or electrical techniques.

A material may be added to fill in at least some portion of the open area within the pores. The filler material may be used to passivate or protect at least some portion of the carbon nanotubes or nanowires.

In an embodiment, the invention is an electrical device including (1) a structure that defines a number of pores; (2) carbon nanotubes within at least some of the number of pores, where the diameter of the carbon nanotubes is less than the diameter of the pores; (3) nanowires on one side of at least some of the number of pores, where the nanowires extend partially through the pores and cover at least some portion of at least some of the carbon nanotubes; (4) a first electrode on a first side of the structure connecting to multiple ones of the carbon nanotubes; and (5) a second electrode on a second (e.g., opposing) side of the structure connecting to multiple ones of the nanowires.

A diode, rectifier, silicon controlled rectifier, or thyristor may be formed, at least in part, according to a technique described in this patent.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of making a transistor device comprising:
providing a template having a top surface and a bottom surface comprising a plurality of openings extending into the template from the top surface toward the bottom surface;
exposing the template having openings to a hydrocarbon gas at a temperature to grow carbon nanotubes in the openings;
forming a mixture of semiconducting carbon nanotubes and metallic carbon nanotubes in the openings;
forming a first electrode region on the top surface to electrically couple to the carbon nanotubes at a first point;
forming a first gate region in the template extending from a point below the top surface and below the first electrode region toward the bottom surface;
forming a second gate region in the template extending from a point below the top surface toward the bottom surface, wherein there is a first carbon nanotube and a second carbon nanotube between the first and second gate regions; and
after forming a mixture of semiconducting carbon nanotubes and metallic carbon nanotubes in the openings, removing metallic carbon nanotubes from the mixture.

2. The method of claim 1 wherein the first carbon nanotube is in a first opening and the second carbon nanotube is in a second opening, separate from the first opening.

3. The method of claim 1 wherein the first and second gate regions are electrically coupled together to form a gate electrode of the transistor device.

4. The method of claim 1 wherein the openings are extend vertically into the template.

5. The method of claim 1 wherein the first gate region extends into the template a distance from about 50 nanometers to about 1000 nanometers.

6. The method of claim 1 wherein there is a third carbon nanotube between the first and second gate regions, and the third carbon nanotube is between the first and second carbon nanotubes.

7. The method of claim 1 comprising:
forming a second electrode region below the top surface to electrically couple to the carbon nanotubes at a second point, wherein first gate region and second date regions comprise a conductive material extending at least between the first and second points;
during the removing metallic carbon nanotubes from the mixture, applying a first voltage between the first and second points of the carbon nanotubes.

8. The method of claim 7 comprising:
during the removing metallic carbon nanotubes from the mixture, applying a second voltage to the first and second gate regions.

9. The method of claim 1 wherein each opening comprises at least two carbon nanotubes.

10. The method of claim 1 wherein the temperature is at least 400 degrees Celsius.

11. The method of claim 10 wherein there are openings with carbon nanotubes in a first region of the template beside of the first gate region, the first region is not between the first and second gate regions.

12. The method of claim 1 wherein the template is provided on a substrate and the substrate is a different material than the template.

13. The method of claim 1 wherein the template is an insulator material and is provided on a substrate that is a conductor material, and the substrate is used to form a second electrode region below the top surface to electrically couple to the carbon nanotubes at a second point.

14. The method of claim 1 further comprising:
before exposing the template containing pores to a hydrocarbon gas, depositing a catalyst into the openings.

15. The method of claim 14 wherein the catalyst is at least one of cobalt or an alloy of cobalt.

16. The method of claim 14 wherein the catalyst is at least one of iron or an alloy of iron.

17. The method of claim 14 wherein the catalyst is at least one of nickel or an alloy of nickel.

18. The method of claim 1 wherein the exposing the template occurs at a temperature in a range from about 750 degrees Celsius to about 850 degrees Celsius.

19. The method of claim 1 wherein the exposing the template at a temperature in a range from about 600 degrees Celsius to about 1000 degrees Celsius.

20. The method of claim 1 wherein the removing metallic carbon nanotubes comprises:
exposing the template with mixture of carbon nanotubes to a reagent, whereby the reagent renders greater numbers of the metallic carbon nanotubes ineffective for transistor operation than semiconducting carbon nanotubes.

21. The method of claim 20 wherein the reagent is a fluid.

22. The method of claim 20 wherein the reagent is nitric acid.

23. The method of claim 1 wherein the removing metallic carbon nanotubes comprises:
applying a voltage to the first gate region that results in a current flow through the carbon nanotubes, whereby the metallic carbon nanotubes are burned off in greater numbers than the semiconducting carbon nanotubes.

24. The method of claim 23 wherein the current flow through a metallic carbon nanotube is at least 15 microamps.

25. The method of claim 23 wherein the current flow through a metallic carbon nanotube is from about 15 microamps to about 25 microamps.

* * * * *